(12) United States Patent
Wang

(10) Patent No.: US 9,473,116 B1
(45) Date of Patent: Oct. 18, 2016

(54) LOW-COST, CAPACITIVE-COUPLED LEVEL SHIFTER SCALABLE FOR HIGH-VOLTAGE APPLICATIONS

(71) Applicant: Balanstring Technology, LLC, Katy, TX (US)

(72) Inventor: Wenwei Wang, Katy, TX (US)

( * ) Notice: Subject to any disclaimer, the term of this patent is extended or adjusted under 35 U.S.C. 154(b) by 0 days.

(21) Appl. No.: 14/770,542

(22) PCT Filed: May 6, 2015

(86) PCT No.: PCT/US2015/029435
§ 371 (c)(1),
(2) Date: Aug. 26, 2015

Related U.S. Application Data

(60) Provisional application No. 62/148,149, filed on Apr. 15, 2015.

(51) Int. Cl.
*H03L 5/00* (2006.01)
*H03K 3/037* (2006.01)

(52) U.S. Cl.
CPC ........................... *H03K 3/037* (2013.01)

(58) Field of Classification Search
CPC ........................................................ H03K 3/037
USPC ........................... 327/333; 326/80, 81
See application file for complete search history.

(56) References Cited

U.S. PATENT DOCUMENTS

| | | | | |
|---|---|---|---|---|
| 4,504,747 A * | 3/1985 | Smith | ............ | H03K 19/017518 326/70 |
| 6,600,679 B2 * | 7/2003 | Tanzawa | ................ | G11C 5/145 365/189.11 |
| 7,480,191 B2 * | 1/2009 | Walker | .................. | H03K 3/037 326/68 |
| 7,564,263 B2 * | 7/2009 | Walker | ............. | H03K 3/356113 326/63 |
| 8,324,955 B2 * | 12/2012 | Roth | .............. | H03K 19/018507 326/80 |
| 9,197,200 B2 * | 11/2015 | Teplechuk | ......... | H03K 3/35613 |
| 2012/0223760 A1 | 9/2012 | Uchino et al. | | |
| 2014/0112053 A1 * | 4/2014 | Youn | .................. | G11C 13/0069 365/148 |
| 2014/0266384 A1 * | 9/2014 | Lan | .................. | H03K 3/356104 327/333 |

* cited by examiner

*Primary Examiner* — Ryan Jager
(74) *Attorney, Agent, or Firm* — R & D Patent Attorneys

(57) ABSTRACT

A level shifter for level-shifting a digital input signal referenced to an input ground potential to a digital output signal referenced to an output ground potential, comprising: a capacitor; a driver circuit, including an input node coupled to the digital input signal, and an output node coupled to a first terminal of the capacitor; a receiver circuit, including a first input node coupled to a second terminal of the capacitor, and an output node coupled to the digital output signal; and a latching feedback circuit, including a first input node coupled to the output node of the receiver circuit, and an output node coupled to the second terminal of the capacitor to latch a toggled signal. An optional resistor can be inserted to increase the output resistance of the latching feedback circuit to be substantially larger than the output resistance of the driver circuit.

20 Claims, 18 Drawing Sheets

LOW-COST, CAPACITIVE-COUPLED LEVEL SHIFTER SCALABLE FOR HIGH-VOLTAGE APPLICATIONS

TECHNICAL FIELD

The present invention relates in general to a level shifter which is operable to, by way of capacitive coupling, level-shift a digital input signal referenced to an input ground potential to a digital output signal referenced to an output ground potential.

BACKGROUND ART

A typical level shifter is designed for level-shifting a low-voltage logic level to another low-voltage logic level, such as from a transistor-transistor logic (TTL) logic level to a complementary metal-oxide-semiconductor (CMOS) logic level, and/or vice versa; and frequently, both the digital input signal and the digital output signal are referenced to an identical ground potential. In contrast, there are some applications wherein a level shifter is required to level-shift a digital input signal referenced to an input ground potential to a digital output signal referenced to an output ground potential which may be either substantially higher or substantially lower than the input ground potential, and the following are several prior-art methods for designing level shifters for these applications.

One of the methods is based on pull-up resistors: the advantages include reasonably low cost; the disadvantages include dependence of ground-potential differential on transistor voltage ratings, more substantial propagation delays as ground-potential differential increases, a large mismatch of propagation delays among a plurality of level-shifter channels with varying ground-potential differentials, significant power consumption, intolerance of substantial slew rate of output ground potential relative to input ground potential, and a low signal frequency bandwidth.

Another one of the methods is based on optocouplers: the advantages include reasonably low cost, being scalable to high-voltage level-shifting, tolerance of high slew rate of output ground potential relative to input ground potential, and a reasonably wide signal frequency bandwidth; the disadvantages include relatively significant propagation delays, and subsequently a substantial mismatch of propagation delays among a plurality of level-shifter channels, and significant power consumption.

Still another one of the methods is based on digital isolators: the advantages include being scalable to high-voltage level-shifting, tolerance of high slew rate of output ground potential relative to input ground potential, reasonably short propagation delays, a reasonably good match of propagation delays among a plurality of level-shifter channels, and a reasonably wide signal frequency bandwidth; the disadvantages include high complexity and high cost, and significant power consumption.

Still another one of the methods is based on pulse transformers: the advantages include being scalable to high-voltage level-shifting, tolerance of substantial slew rate of output ground potential relative to input ground potential, and reasonably short propagation delays; the disadvantages include high cost, substantial size and weight, substantial power consumption, and a narrow signal frequency bandwidth.

Still another one of the methods is based on bootstrap high-side gate drivers: the advantages include being scalable to high-voltage level-shifting of up to hundreds of volts, tolerance of high slew rate of output ground potential relative to input ground potential, and a reasonable signal frequency bandwidth; the disadvantages include high complexity and high cost, significant propagation delays, a requirement of output ground potential being higher than input ground potential, significant power consumption, limited output voltage range, and a significant mismatch of propagation delays among a plurality of level-shifter channels.

SUMMARY OF INVENTION

Technical Problem

For a typical level shifter application, the voltage differential between the output ground potential and the input ground potential is nominally direct-current (DC). However, because of time-varying load current requirements, the output ground potential may change quickly relative to the input ground potential, thereby creating voltage transients on the output ground potential that may subsequently interfere with a signal being level-shifted. As the voltage differential increases, the output ground potential may change more quickly relative to the input ground potential. A slew rate describes the maximum rate of voltage change per unit of time. Therefore, it is imperative for a level shifter to tolerate a certain slew rate of the output ground potential relative to the input ground potential.

There are some applications that require a level shifter to possess the following features: being scalable to work with a large voltage differential between the output ground potential and the input ground potential; an ability to tolerate a substantial slew rate of the output ground potential relative to the input ground potential; a short propagation delay; an excellent match of propagation delays among a plurality of level-shifter channels; and a wide signal frequency bandwidth. And it is highly desirable if the level shifter also consumes low power and is low cost. As an example, one such application is in a battery management system (BMS), especially in active-balancing a long series-connected battery pack (a long series-connected supercapacitor pack is another good example of an application). A cell positive-terminal voltage relative to a BMS ground potential may vary from a few volts for a bottom cell in the battery pack to hundreds of volts or even over 1,000 volts for a top cell in the battery pack. A power switch driver is ground-referenced to each cell positive-terminal, and it is controlled by a controller referenced to the BMS ground potential via a level shifter. Therefore, the level shifter is required to level-shift a controller signal referenced to the BMS ground potential to a power-switch driver signal referenced to a cell positive-terminal voltage which is scalable from a few volts to possibly over 1,000 volts. When the battery pack is discharging or being charged, there may be a substantial slew rate to a cell positive-terminal voltage relative to the BMS ground potential. And for the controller to control a plurality of power switch drivers simultaneously, there must be an excellent match of propagation delays among a corresponding plurality of level-shifter channels; and the controller signals may have a wide frequency bandwidth. And it is highly desirable to use low-power and low-cost level shifters, because the number of level shifters required is equal to the number of battery cells.

None of the known prior-art level shifters for high-voltage applications possesses all of the aforementioned features.

Solution to Problem

In a first embodiment of the invention, a level shifter for level-shifting a digital input signal referenced to an input ground potential $GND_{IN}$ to a digital output signal referenced to an output ground potential $GND_{OUT}$, wherein $GND_{OUT}$ is higher than or equal to or lower than $GND_{IN}$, comprising: a driver circuit including an input node and an output node, powered by an input power supply $V_{IN}$ referenced to $GND_{IN}$, and configured as inverting or non-inverting, and wherein the input node is coupled to the digital input signal, and wherein the output node toggles when the digital input signal toggles; a capacitor including a first terminal and a second terminal, wherein the first terminal is coupled to the output node of the driver circuit, and wherein the second terminal toggles in sync with the toggling of the output node of the driver circuit; a first resistor including a first terminal and a second terminal, wherein the first terminal of the first resistor is coupled to the second terminal of the capacitor; a receiver circuit including a first input node and an output node, powered by an output power supply $V_{OUT}$ referenced to $GND_{OUT}$, and wherein the first input node is coupled to the second terminal of the capacitor, and wherein the output node is coupled to the digital output signal, and wherein the digital output signal toggles when the second terminal of the capacitor toggles; and a latching feedback circuit including a first input node and an output node, powered by $V_{OUT}$ referenced to $GND_{OUT}$, and wherein the first input node is coupled to the output node of the receiver circuit, and wherein the output node is coupled to the second terminal of the resistor, and wherein the sum of the output resistance of the latching feedback circuit and the resistance of the first resistor is substantially larger than the output resistance of the driver circuit, and configured as non-inverting if the receiver circuit is non-inverting, or configured as inverting if the receiver circuit is inverting, thereby providing a positive feedback loop to latch a toggled signal from the second terminal of the capacitor to the receiver circuit.

The capacitor essentially serves as a toggling capacitor. In one embodiment, the capacitance of the capacitor is adapted to be substantially larger than the input capacitance of the first input node of the receiver circuit. In one embodiment, the receiver circuit may include a second input node for initializing or enabling the receiver circuit, and may further comprise an AND gate or a NAND gate or an OR gate or a NOR gate. In one embodiment, the latching feedback circuit also may include a second input node for initializing or enabling the latching feedback circuit, and may further comprise an AND gate or a NAND gate or an OR gate or a NOR gate. Before the level shifter functions properly, the first input node of the receiver circuit and the output node of the driver circuit are synchronized to be at an initial logic level. In one embodiment, both the output node of the driver circuit and the output node of the latching feedback circuit are preferably adapted to be field-effect-transistor (FET) complimentary output nodes.

The slew rate of $GND_{OUT}$ relative to $GND_{IN}$ for the level shifter is primarily determined by the capacitance of the capacitor, and by the combined output resistance of the driver circuit and the latching feedback circuit and some additional current-limiting resistor(s).

To protect the level shifter in high-voltage applications, in one embodiment, one or more zener diodes are respectively coupled across related power supplies of the level shifter. And to protect the first input node of the receiver circuit and the output node of the latching feedback circuit and the output node of the driver circuit against any excessive voltage and/or current stress, in various embodiments, clamping diodes and/or current-limiting resistors are added to the level shifter.

In a second embodiment of the invention, a level shifter for level-shifting a digital input signal referenced to an input ground potential $GND_{IN}$ to a digital output signal referenced to an output ground potential $GND_{OUT}$, wherein $GND_{OUT}$ is higher than or equal to or lower than $GND_{IN}$, comprising: a driver circuit including an input node and an output node, powered by an input power supply $V_{IN}$ referenced to $GND_{IN}$, and configured as inverting or non-inverting, and wherein the input node is coupled to the digital input signal, and wherein the output node toggles when the digital input signal toggles; a capacitor including a first terminal and a second terminal, wherein the first terminal is coupled to the output node of the driver circuit, and wherein the second terminal toggles in sync with the toggling of the output node of the driver circuit; a receiver circuit including a first input node and an output node, powered by an output power supply $V_{OUT}$ referenced to $GND_{OUT}$, and wherein the first input node is coupled to the second terminal of the capacitor, and wherein the output node is coupled to the digital output signal, and wherein the digital output signal toggles when the second terminal of the capacitor toggles; and a latching feedback circuit including a first input node and an output node, powered by $V_{OUT}$ referenced to $GND_{OUT}$, and wherein the first input node is coupled to the output node of the receiver circuit, and wherein the output node is coupled to the second terminal of the capacitor, and wherein the output resistance of the latching feedback circuit is substantially larger than the output resistance of the driver circuit, and configured as non-inverting if the receiver circuit is non-inverting, or configured as inverting if the receiver circuit is inverting, thereby providing a positive feedback loop to latch a toggled signal from the second terminal of the capacitor to the receiver circuit.

In a third embodiment of the invention, a level shifter for level-shifting a digital input signal referenced to an input ground potential $GND_{IN}$ to a digital output signal referenced to an output ground potential $GND_{OUT}$, wherein $GND_{OUT}$ is higher than or equal to or lower than $GND_{IN}$, comprising: a driver circuit including an input node and an output node, powered by an input power supply $V_{IN}$ referenced to $GND_{IN}$, and configured as inverting or non-inverting, and wherein the input node is coupled to the digital input signal, and wherein the output node toggles when the digital input signal toggles; a capacitor including a first terminal and a second terminal, wherein the first terminal is coupled to the output node of the driver circuit, and wherein the second terminal toggles in sync with the toggling of the output node of the driver circuit; a first resistor including a first terminal and a second terminal, wherein the first terminal of the first resistor is coupled to the second terminal of the capacitor; a non-inverting receiver circuit including a first input node and an output node, powered by an output power supply $V_{OUT}$ referenced to $GND_{OUT}$, and wherein the first input node is coupled to the second terminal of the capacitor, and wherein the output node is coupled both to the digital output signal and to the second terminal of the first resistor, and wherein the sum of the output resistance of the non-inverting receiver circuit and the resistance of the first resistor is substantially larger than the output resistance of the driver circuit, and wherein the digital output signal toggles when the second terminal of the capacitor toggles, and wherein the output node provides a positive feedback loop to latch a toggled signal from the second terminal of the capacitor to the non-inverting receiver circuit.

Advantageous Effects of Invention

It is an advantageous effect of the invention to achieve a level shifter which is scalable to a large voltage differential between the output ground potential and the input ground potential. This scalability is essentially limited only by the voltage rating of the toggling capacitor.

Another advantageous effect of the invention is the tolerance of a substantial slew rate of the output ground potential relative to the input ground potential. A substantial slew rate is critical in some real-world level-shifter applications.

Still another advantageous effect of the invention is the intrinsically short propagation delay of the level shifter. The short propagation delay results from the substantially instantaneous toggling of the capacitor in transmitting a signal from the output node of the driver circuit to the first input node of the receiver circuit.

Still another advantageous effect of the invention is the intrinsically excellent match of propagation delays among a plurality of level shifter channels. The is achieved by charging up a plurality of respective toggling capacitors for the plurality of level shifters to respective output ground potentials, thereby essentially eliminating the effect of ground-potential differences on the propagation delays.

Still another advantageous effect of the invention is low power consumption if the input capacitance and the input current of the first input node of the receiver circuit are minimized—which is the case for almost any CMOS or other equivalent input gate circuit. Any general-purpose input-output (I/O) with a FET complementary output node is able to drive the toggling capacitor with minimal power consumption.

Still another major advantageous effect of the invention is low cost. This is because only a capacitor (which may be rated for a high voltage if necessary) with a small capacitance is required if the input capacitance and the input current of the first input node of the receiver circuit are minimized, and because all other circuits and components of the level shifter are simple and low cost. This cost advantage may be very beneficial to successful commercialization of the invention.

Other advantages and benefits of the invention will become readily apparent upon further review of the following drawings.

BRIEF DESCRIPTION OF THE DRAWINGS

For a more complete understanding of the invention, reference is now made to the following descriptions taken in conjunction with the accompanying drawings.

FIG. 1, illustrates how the level shifter functions as a step-by-step process, in accordance with the first embodiment of the invention.

MODES FOR CARRYING OUT THE INVENTION

Figure 1:
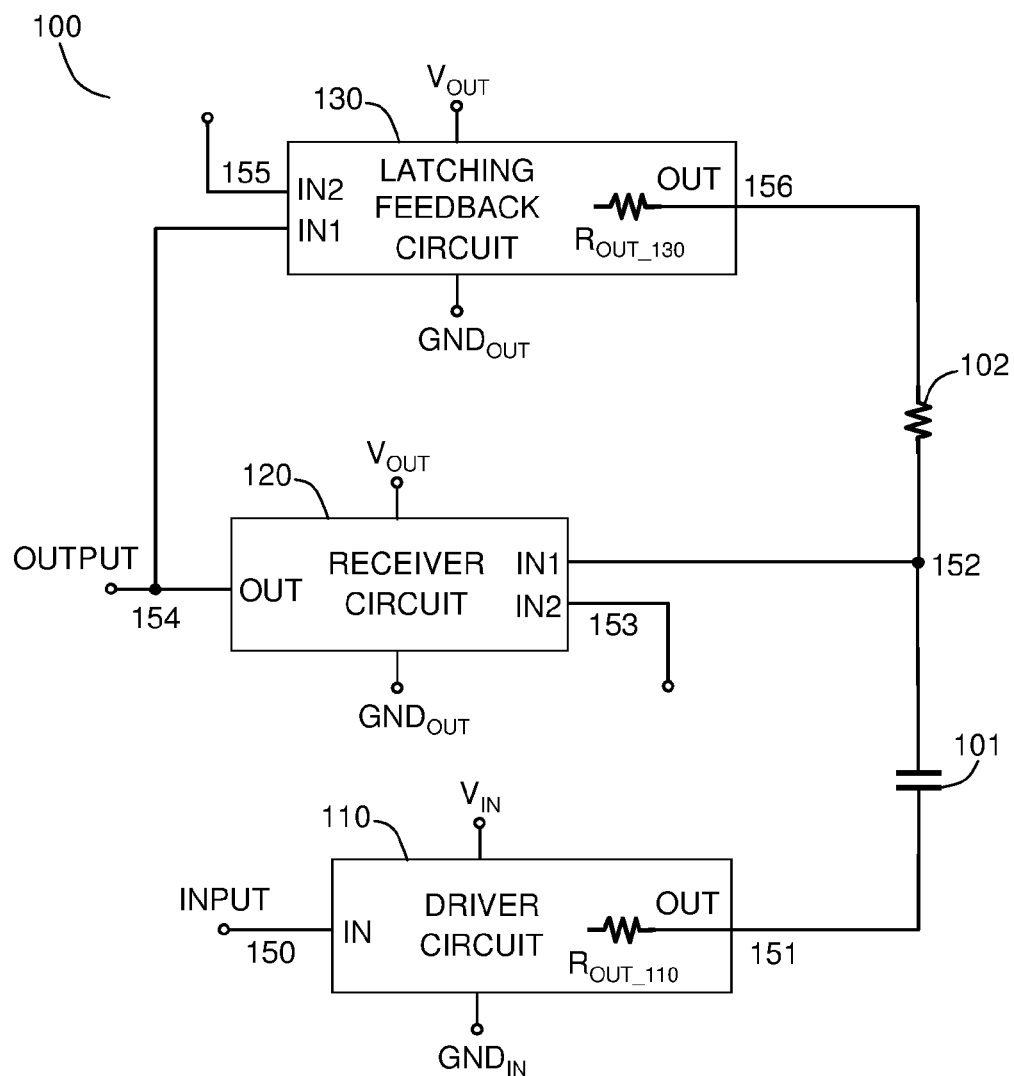
FIG. 1 is a block diagram illustrating the basic structure of a level shifter with a toggling capacitor, in accordance with a first embodiment of the invention.

In a first embodiment of the invention, as illustrated in FIG. 1, a level shifter 100 for level-shifting a digital input signal (at node 150) referenced to an input ground potential $GND_{IN}$ to a digital output signal (at node 154) referenced to an output ground potential $GND_{OUT}$, wherein $GND_{OUT}$ is higher than or equal to or lower than $GND_{IN}$, comprising: a driver circuit 110 including an input node (at node 150) and an output node (at node 151), powered by an input power supply $V_{IN}$ referenced to $GND_{IN}$, and configured as inverting or non-inverting (depending on the requirement(s) of a specific embodiment), and wherein the input node is coupled to the digital input signal, and wherein the output node toggles when the digital input signal toggles; a capacitor 101 including a first terminal (at node 151) and a second terminal (at node 152), wherein the first terminal is coupled to the output node of the driver circuit 110, and wherein the second terminal toggles in sync with the toggling of the output node of the driver circuit 110; a first resistor 102 including a first terminal (at node 152) and a second terminal (at node 156), wherein the first terminal of the first resistor 102 is coupled to the second terminal of the capacitor 101; a receiver circuit 120 including a first input node (coupled to node 152) and an output node (at node 154), powered by an output power supply $V_{OUT}$ referenced to $GND_{OUT}$, and wherein the first input node is coupled to the second terminal of the capacitor 101, and wherein the output node is coupled to the digital output signal, and wherein the digital output signal toggles when the second terminal of the capacitor 101 toggles; and a latching feedback circuit 130 including a first input node (at node 154) and an output node (at node 156), powered by $V_{OUT}$ referenced to $GND_{OUT}$, and wherein the first input node is coupled to the output node of the receiver circuit 120, and wherein the output node is coupled to the second terminal of the resistor 102, and wherein the sum of the output resistance $R_{OUT\_130}$ of the latching feedback circuit 130 and the resistance of the first resistor 102 is substantially larger than the output resistance $R_{OUT\_110}$ of the driver circuit 110, and configured as non-inverting if the receiver circuit 120 is non-inverting, or configured as inverting if the receiver circuit 120 is inverting, thereby providing a positive feedback loop to latch a toggled signal from the second terminal of the capacitor 101 to the receiver circuit 120. In one embodiment, the receiver circuit 120 may further include an optional second input node 153 for initializing or enabling the receiver circuit 120. In one embodiment, the latching feedback circuit 130 may further include an optional second input node 155 for initializing or enabling the latching feedback circuit 130. A few exemplary embodiments of the driver circuit 110, the receiver circuit 120 and the latching feedback circuit 130 are disclosed as follows.

Figure 2:
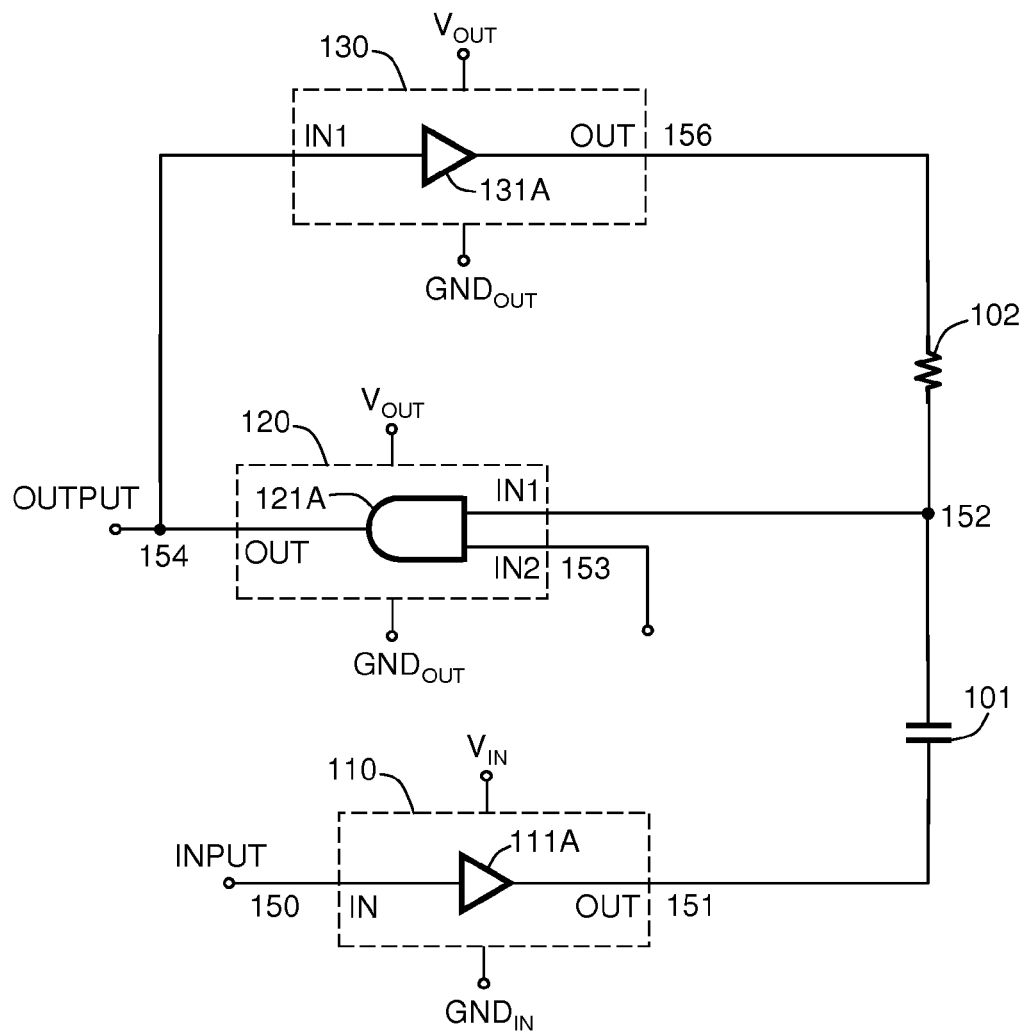
FIG. 2 illustrates some exemplary embodiments of the driver circuit, the receiver circuit and the latching feedback circuit, in accordance with the first embodiment of the invention.

FIG. 2 illustrates some exemplary embodiments of the driver circuit 110, the receiver circuit 120 and the latching feedback circuit 130. The driver circuit 110 further comprises a non-inverting buffer 111A including: an input terminal and an output terminal, coupled respectively to the input node and the output node of the driver circuit 110. The receiver circuit 120 further comprises an AND gate 121A including: a first input terminal and a second input terminal and an output terminal, coupled respectively to the first input node and the optional second input node 153 and the output node of the receiver circuit 120. The latching feedback circuit 130 further comprises a non-inverting buffer 131A including: an input terminal and an output terminal, coupled respectively to the first input node and the output node of the latching feedback circuit 130. Both the AND gate 121A and the buffer 131A are non-inverting, and are operable to provide a positive feedback loop to latch a toggled signal from the second terminal of the capacitor 101 to the receiver circuit 120. When the second input node 153 is at logic low, the output of the AND gate 121A is forced to be at logic low; then the output of the non-inverting buffer 131A is also at logic low thereby initializing the first input node of the receiver circuit 120 to be at logic low. And when the second input node 153 is at logic high, the AND gate 121A is enabled to function as a non-inverting buffer.

Figure 3:
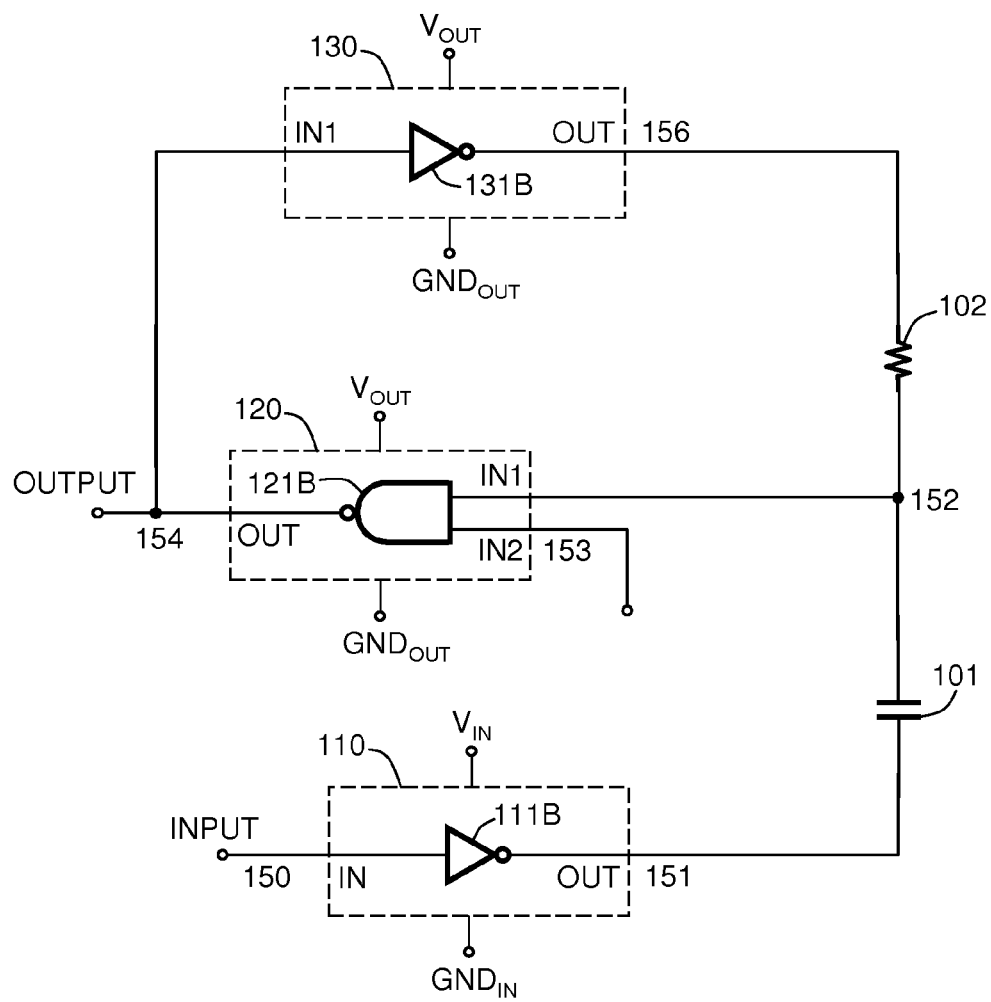
FIG. 3 illustrates more exemplary embodiments of the driver circuit, the receiver circuit and the latching feedback circuit, in accordance with the first embodiment of the invention.

FIG. 3 illustrates more exemplary embodiments of the driver circuit 110, the receiver circuit 120 and the latching feedback circuit 130. The driver circuit 110 further comprises an inverting buffer 111B including: an input terminal and an output terminal, coupled respectively to the input node and the output node of the driver circuit 110. The receiver circuit 120 further comprises a NAND gate 121B including: a first input terminal and a second input terminal and an output terminal, coupled respectively to the first input node and the optional second input node 153 and the output node of the receiver circuit 120. The latching feedback circuit 130 further comprises an inverting buffer 131B including: an input terminal and an output terminal, coupled respectively to the first input node and the output node of the latching feedback circuit 130. Both the NAND gate 121B and the buffer 131B are inverting, and are operable to provide a positive feedback loop to latch a toggled signal from the second terminal of the capacitor 101 to the receiver circuit 120. When the second input node 153 is at logic low, the output of the NAND gate 121B is forced to be at logic high; then the output of the inverting buffer 131B is at logic low thereby initializing the first input node of the receiver circuit 120 to be at logic low. And when the second input node 153 is at logic high, the NAND gate 121B is enabled to function as an inverting buffer.

Figure 4:
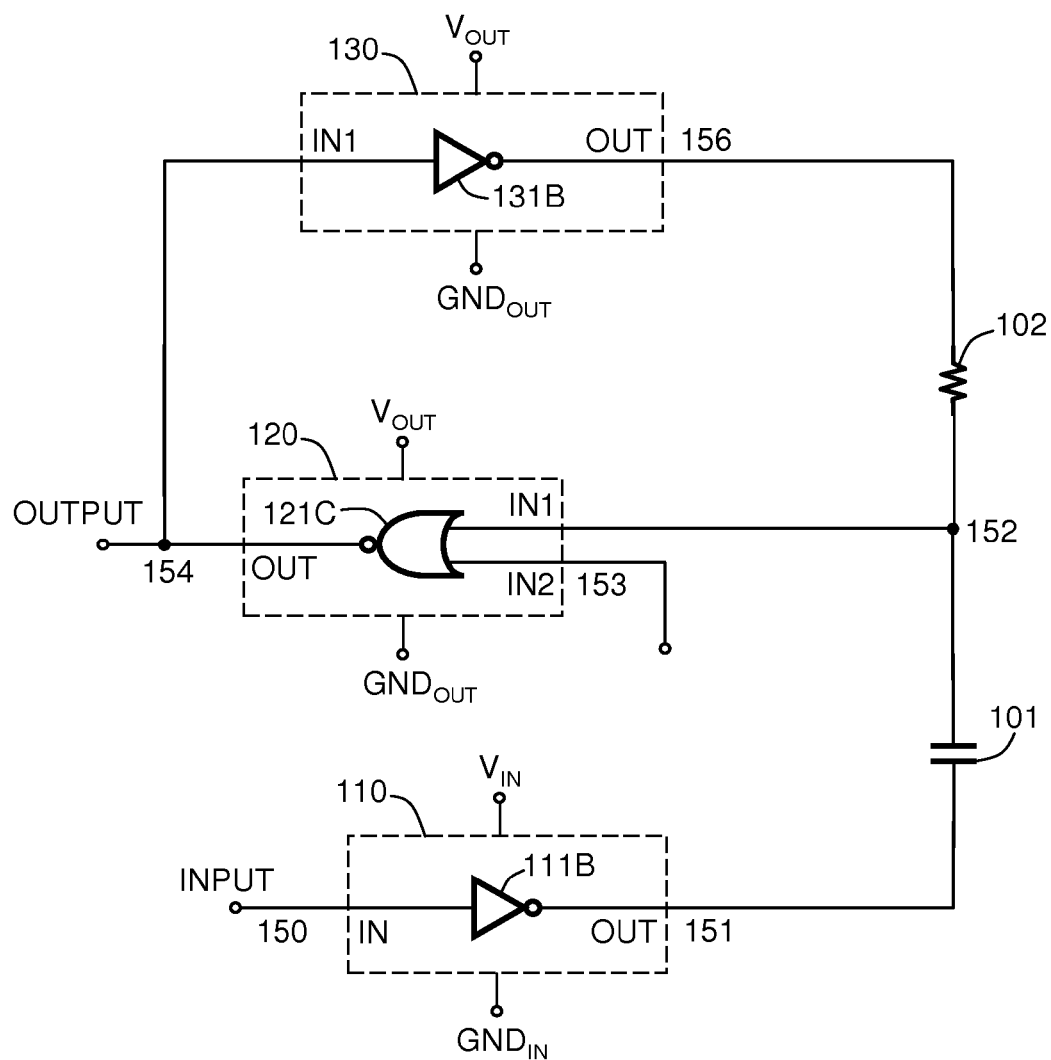
FIG. 4 illustrates still more exemplary embodiment of the receiver circuit, in accordance with the first embodiment of the invention.

FIG. 4 illustrates still more exemplary embodiment of the receiver circuit 120. The receiver circuit 120 further comprises a NOR gate 121C including: a first input terminal and a second input terminal and an output terminal, coupled respectively to the first input node and the optional second input node 153 and the output node of the receiver circuit 120. Both the NOR gate 121C and the buffer 131B are inverting, and are operable to provide a positive feedback loop to latch a toggled signal from the second terminal of the capacitor 101 to the receiver circuit 120. When the second input node 153 is at logic high, the output of the NOR gate 121C is forced to be at logic low; then the output of the inverting buffer 131B is at logic high thereby initializing the first input node of the receiver circuit 120 to be at logic high. And when the second input node 153 is at logic low, the NOR gate 121C is enabled to function as an inverting buffer.

Figure 5:
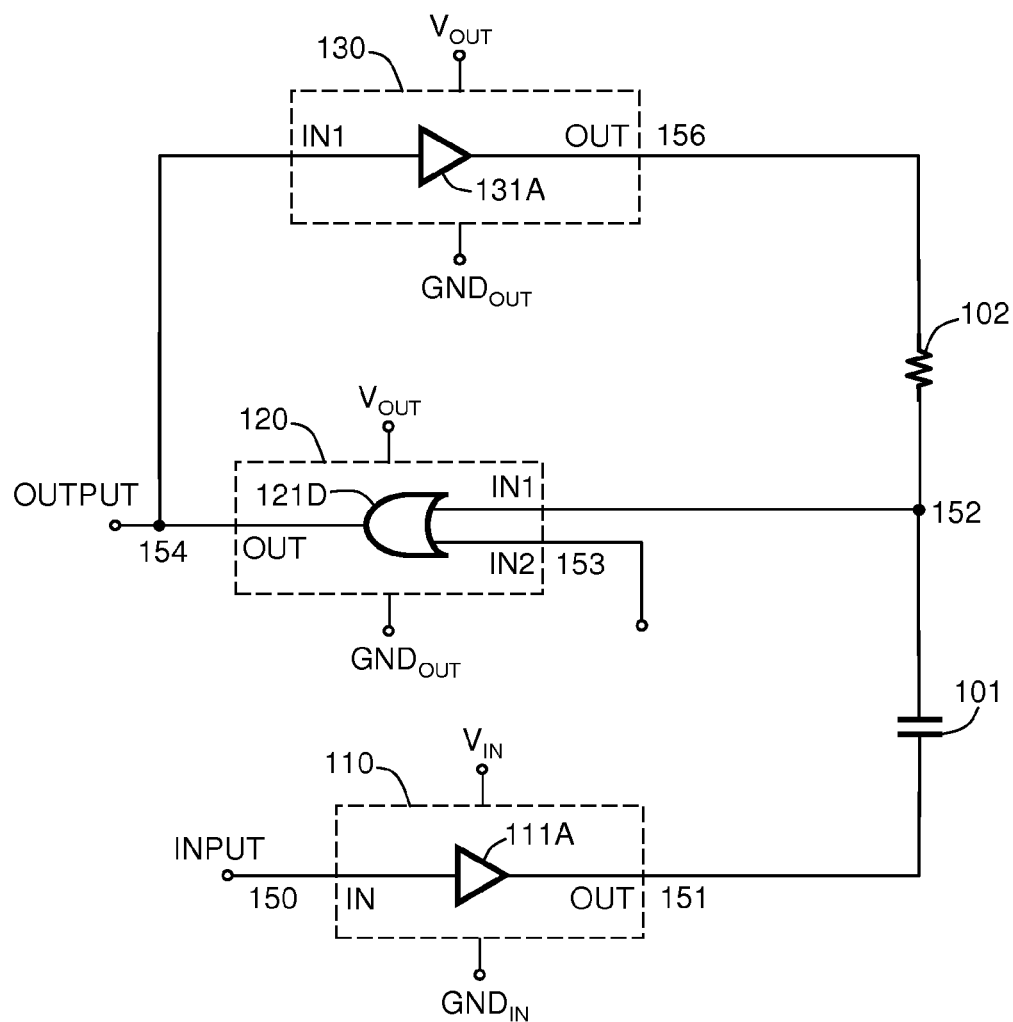
FIG. 5 illustrates still more exemplary embodiment of the receiver circuit, in accordance with the first embodiment of the invention.

FIG. 5 illustrates still more exemplary embodiment of the receiver circuit 120. The receiver circuit 120 further comprises an OR gate 121O including: a first input terminal and a second input terminal and an output terminal, coupled respectively to the first input node and the optional second input node 153 and the output node of the receiver circuit 120. Both the OR gate 121O and the buffer 131A are non-inverting, and are operable to provide a positive feedback loop to latch a toggled signal from the second terminal of the capacitor 101 to the receiver circuit 120. When the second input node 153 is at logic high, the output of the OR gate 121O is forced to be at logic high; then the output of the non-inverting buffer 131A is at logic high thereby initializing the first input node of the receiver circuit 120 to be at logic high. And when the second input node 153 is at logic low, the OR gate 121O is enabled to function as a non-inverting buffer.

Figure 6:
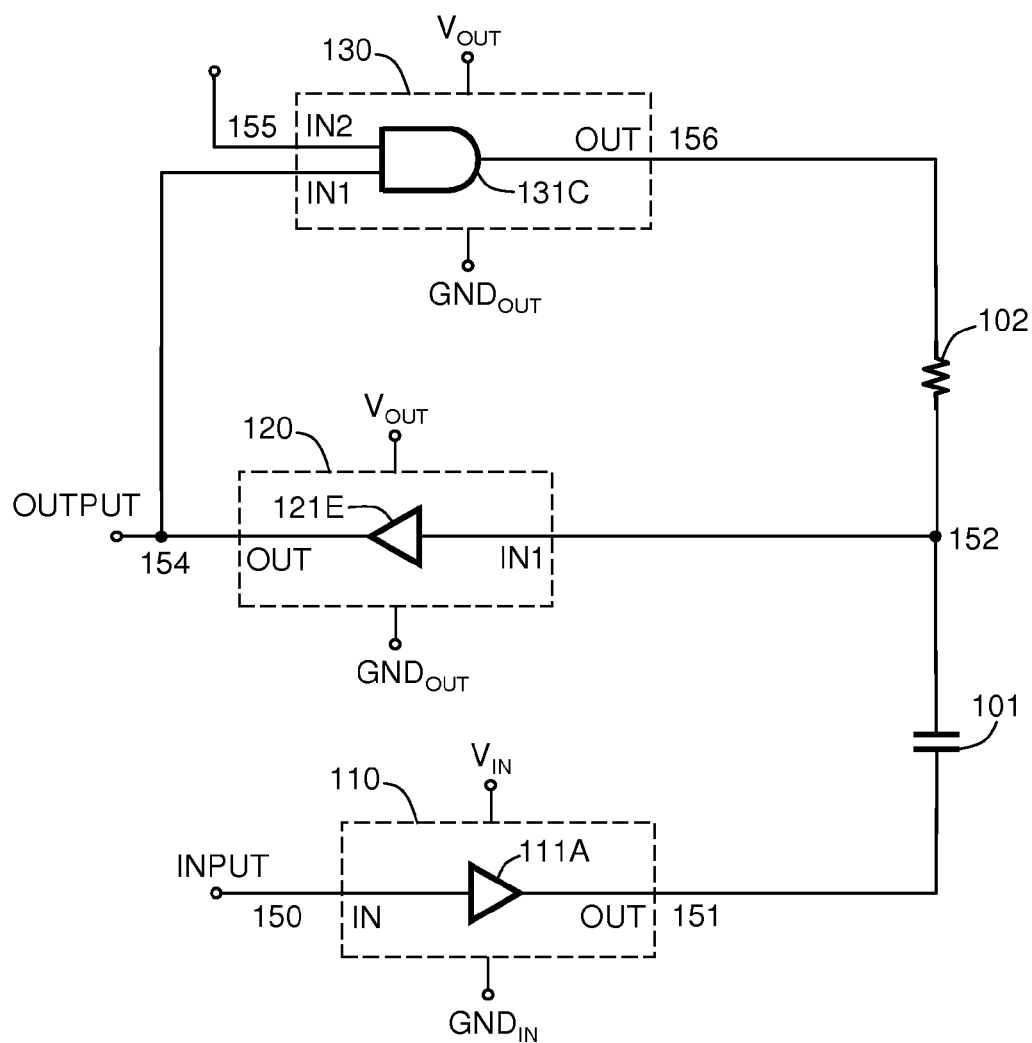
FIG. 6 illustrates still more exemplary embodiments of the receiver circuit and the latching feedback circuit, in accordance with the first embodiment of the invention.

FIG. 6 illustrates still more exemplary embodiments of the receiver circuit 120 and the latching feedback circuit 130. The receiver circuit 120 further comprises a non-inverting buffer 121E including: an input terminal and an output terminal, coupled respectively to the first input node and the output node of the receiver circuit 120. The latching feedback circuit 130 further comprises an AND gate 131C including: a first input terminal and a second input terminal and an output terminal, coupled respectively to the first input node and the optional second input node 155 and the output node of the latching feedback circuit 130. Both the buffer 121E and the AND gate 131C are non-inverting, and are operable to provide a positive feedback loop to latch a toggled signal from the second terminal of the capacitor 101 to the receiver circuit 120. When the second input node 155 is at logic low, the output of the AND gate 131C is forced to be at logic low thereby initializing the first input node of the receiver circuit 120 to be at logic low. And when the second input node 155 is at logic high, the AND gate 131C is enabled to function as a non-inverting buffer.

Figure 7:
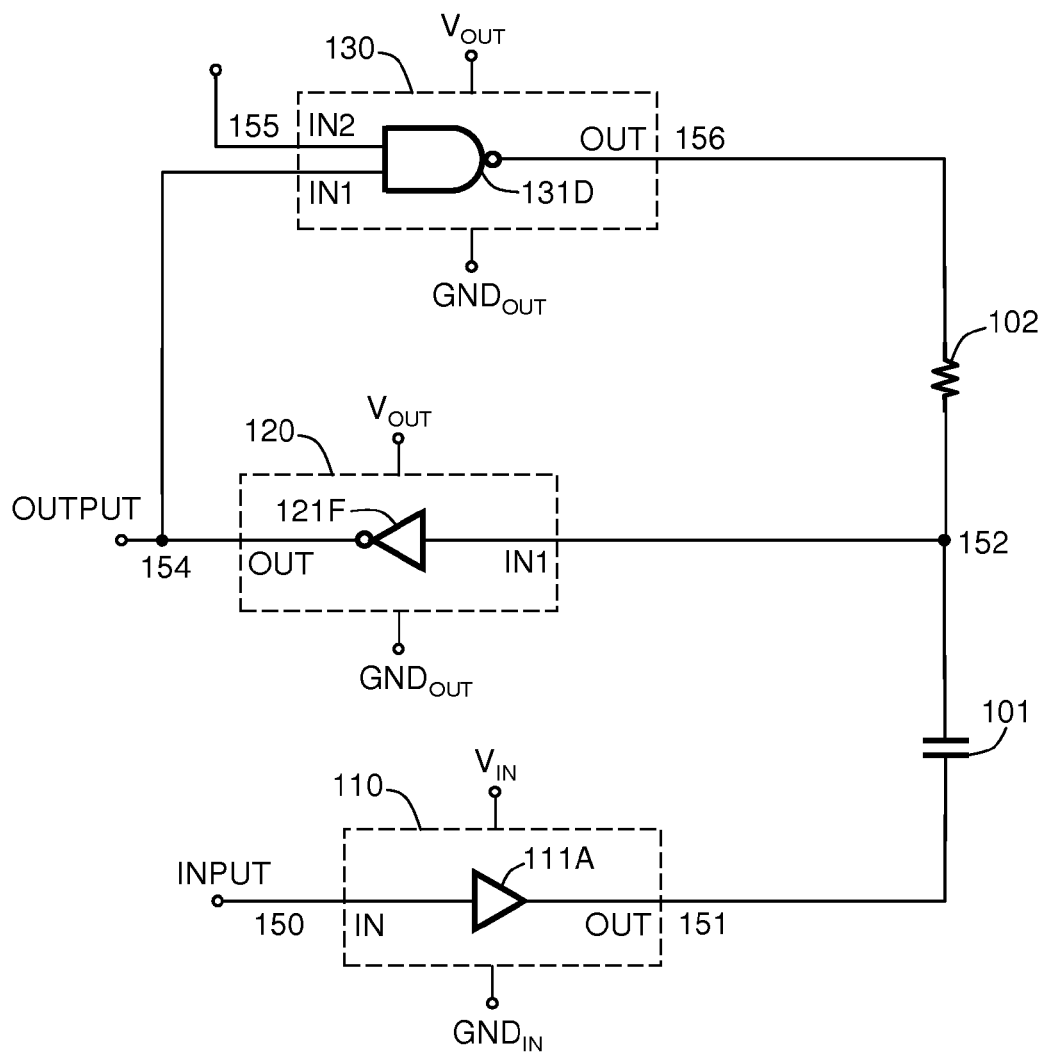
FIG. 7 illustrates still more exemplary embodiments of the receiver circuit and the latching feedback circuit, in accordance with the first embodiment of the invention.

FIG. 7 illustrates still more exemplary embodiments of the receiver circuit 120 and the latching feedback circuit 130. The receiver circuit 120 further comprises an inverting buffer 121F including: an input terminal and an output terminal, coupled respectively to the first input node and the output node of the receiver circuit 120. The latching feedback circuit 130 further comprises a NAND gate 1310 including: a first input terminal and a second input terminal and an output terminal, coupled respectively to the first input node and the optional second input node 155 and the output node of the latching feedback circuit 130. Both the buffer 121F and the NAND gate 1310 are inverting, and are operable to provide a positive feedback loop to latch a toggled signal from the second terminal of the capacitor 101 to the receiver circuit 120. When the second input node 155 is at logic low, the output of the NAND gate 1310 is forced to be at logic high thereby initializing the first input node of the receiver circuit 120 to be at logic high. And when the second input node 155 is at logic high, the NAND gate 1310 is enabled to function as an inverting buffer.

Figure 8:
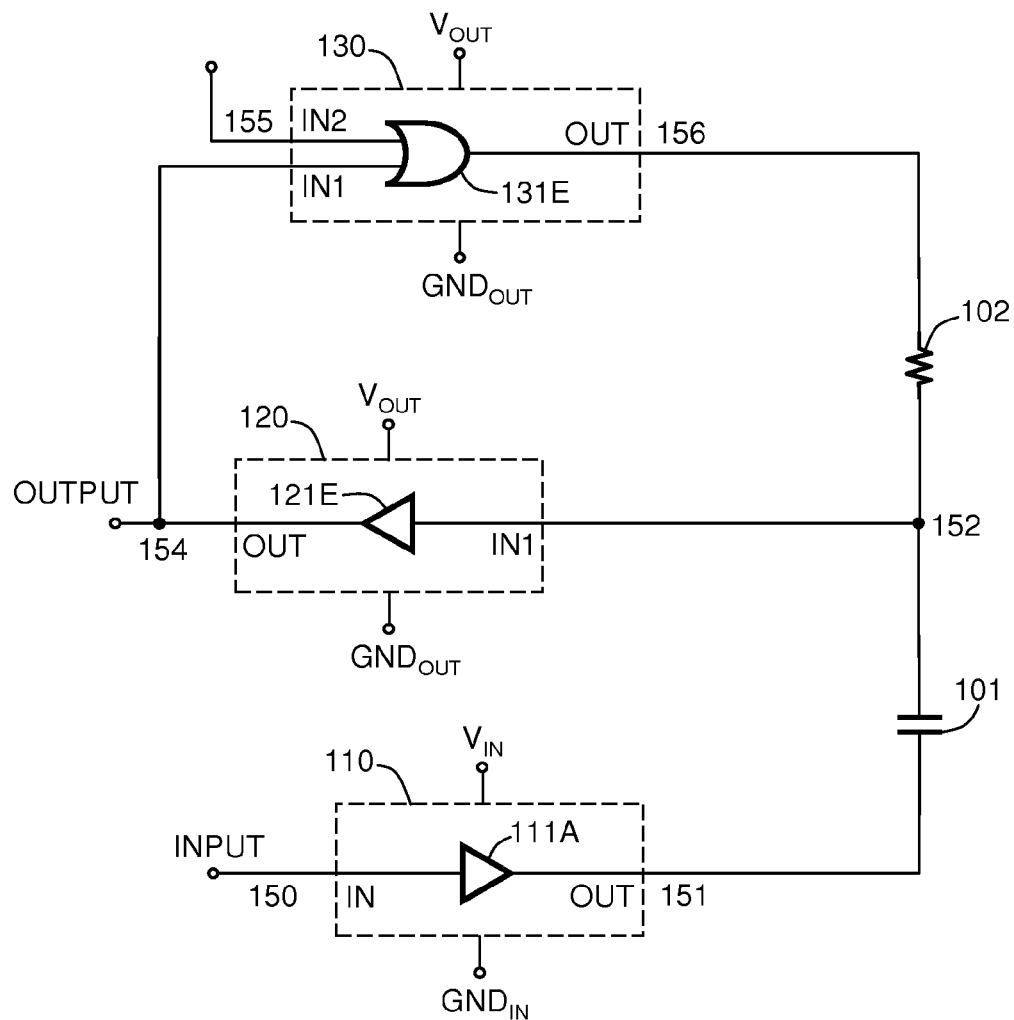
FIG. 8 illustrates still more exemplary embodiment of the latching feedback circuit, in accordance with the first embodiment of the invention.

FIG. 8 illustrates still more exemplary embodiment of the latching feedback circuit 130. The latching feedback circuit 130 further comprises an OR gate 131E including: a first input terminal and a second input terminal and an output terminal, coupled respectively to the first input node and the optional second input node 155 and the output node of the latching feedback circuit 130. Both the buffer 121E and the OR gate 131E are non-inverting, and are operable to provide a positive feedback loop to latch a toggled signal from the second terminal of the capacitor 101 to the receiver circuit 120. When the second input node 155 is at logic high, the output of the OR gate 131E is forced to be at logic high thereby initializing the first input node of the receiver circuit 120 to be at logic high. And when the second input node 155 is at logic low, the OR gate 131E is enabled to function as a non-inverting buffer.

Figure 9:
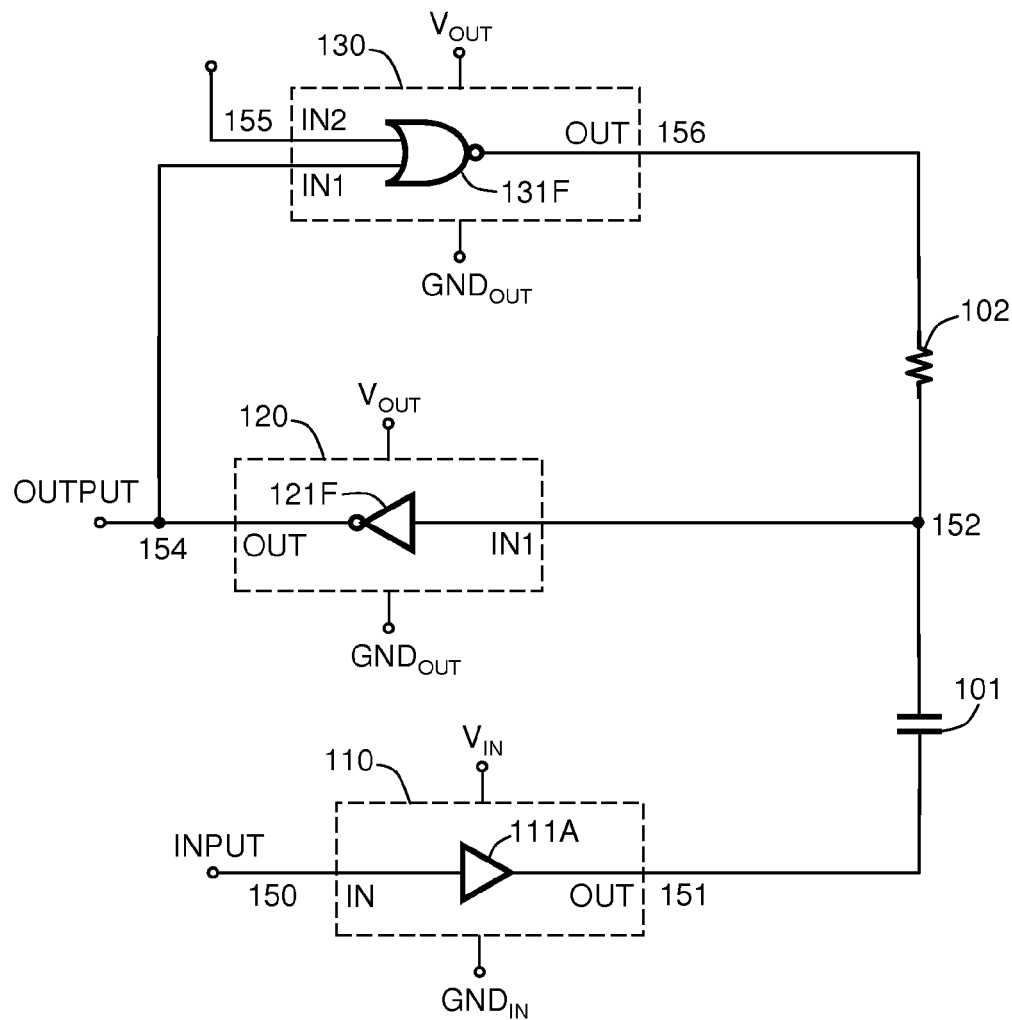
FIG. 9 illustrates still more exemplary embodiment of the latching feedback circuit, in accordance with the first embodiment of the invention.

FIG. 9 illustrates still more exemplary embodiment of the latching feedback circuit 130. The latching feedback circuit 130 further comprises a NOR gate 131F including: a first input terminal and a second input terminal and an output terminal, coupled respectively to the first input node and the optional second input node 155 and the output node of the latching feedback circuit 130. Both the buffer 121F and the NOR gate 131F are inverting, and are operable to provide a positive feedback loop to latch a toggled signal from the second terminal of the capacitor 101 to the receiver circuit 120. When the second input node 155 is at logic high, the output of the NOR gate 131F is forced to be at logic low thereby initializing the first input node of the receiver circuit 120 to be at logic low. And when the second input node 155 is at logic low, the NOR gate 131F is enabled to function as an inverting buffer.

Refer back to FIG. 1, the output node of the driver circuit 110 is at voltage $GND_{IN}$ for logic low and at voltage $V_{IN}$ for logic high; while the digital output signal or the output node of the receiver circuit 120 or the output node of the latching feedback circuit 130 is at voltage $GND_{OUT}$ for logic low and at voltage $V_{OUT}$ for logic high. Therefore, toggling the output node of the driver circuit 110 is equivalent to switching between logic low at $GND_{IN}$ and logic high at $V_{IN}$; while toggling the digital output signal or the output node of the receiver circuit 120 or the output node of the latching feedback circuit 130 is equivalent to switching between logic low at $GND_{OUT}$ and logic high at $V_{OUT}$.

The functioning of a level shifter of the invention in various embodiments is based on capacitive coupling: since the voltage across the capacitor 101 cannot be changed instantaneously, when the output node of the driver circuit 110 switches from logic low at $GND_{IN}$ to logic high at $V_{IN}$, the first terminal of the capacitor 101 also switches from logic low at $GND_{IN}$ to logic high at $V_{IN}$, while the voltage at the second terminal of the capacitor 101 instantaneously jumps up by approximately $(V_{IN}-GND_{IN})$ thereby sending a logic high signal to the first input node of the receiver circuit 120; and vice versa, when the output node of the driver circuit 110 switches from logic high at $V_{IN}$ to logic low at $GND_{IN}$, the first terminal of the capacitor 101 also switches from logic high at $V_{IN}$ to logic low at $GND_{IN}$, while the voltage at the second terminal of the capacitor 101 instantaneously drops down by approximately $(V_{IN}-GND_{IN})$ thereby sending a logic low signal to the first input node of the receiver circuit 120. Therefore through capacitive coupling, the second terminal of the capacitor 101 toggles in sync with the toggling of the output node of the driver circuit 110 by approximately the same voltage differential of $(V_{IN}-GND_{IN})$, and subsequently toggles the first input node of the receiver circuit 120 by either charging the first input node of the receiver circuit 120 from logic low to above a logic-high threshold voltage, or by discharging the first input node of the receiver circuit 120 from logic high to below a logic-low threshold voltage. Therefore, the capacitor 101 essentially functions as a toggling capacitor, and the level shifter is essentially edge-triggered. And since a toggling speed is essentially independent of the voltage across the capacitor 101, it is a highly desirable advantage that the propagation delay of the level shifter of the invention is independent of the voltage differential between $GND_{OUT}$ and $GND_{IN}$, but is primarily dependent on the propagation delays of the driver circuit 110 and the receiver circuit 120.

However, the functioning of the aforementioned capacitive-coupling is contingent on one condition: it is imperative that the sum of the output resistance $R_{OUT\_130}$ of the latching feedback circuit 130 and the resistance of the first resistor 102 is substantially larger than the output resistance $R_{OUT\_110}$ of the driver circuit 110, so that the output node of the latching feedback circuit 130 does not significantly oppose any toggling at the second terminal of the capacitor 101 before the latching feedback circuit 130 loops back to latch a toggled signal to the receiver circuit 120.

For a level shifter of the invention in various embodiments to function properly after a power-up or any other reset, it is imperative that the first input node of the receiver circuit 120 and the output node of the driver circuit 110 are synchronized to be at an initial logic level, i.e., if the output node of the driver circuit 110 is at $GND_{IN}$ for logic low initially, the first input node of the receiver circuit 120 is synchronized to be at $GND_{OUT}$ for logic low; and vice versa, if the output node of the driver circuit 110 is at $V_{IN}$ for logic high initially, the first input node of the receiver circuit 120 is synchronized to be at $V_{OUT}$ for logic high.

Figure 10:
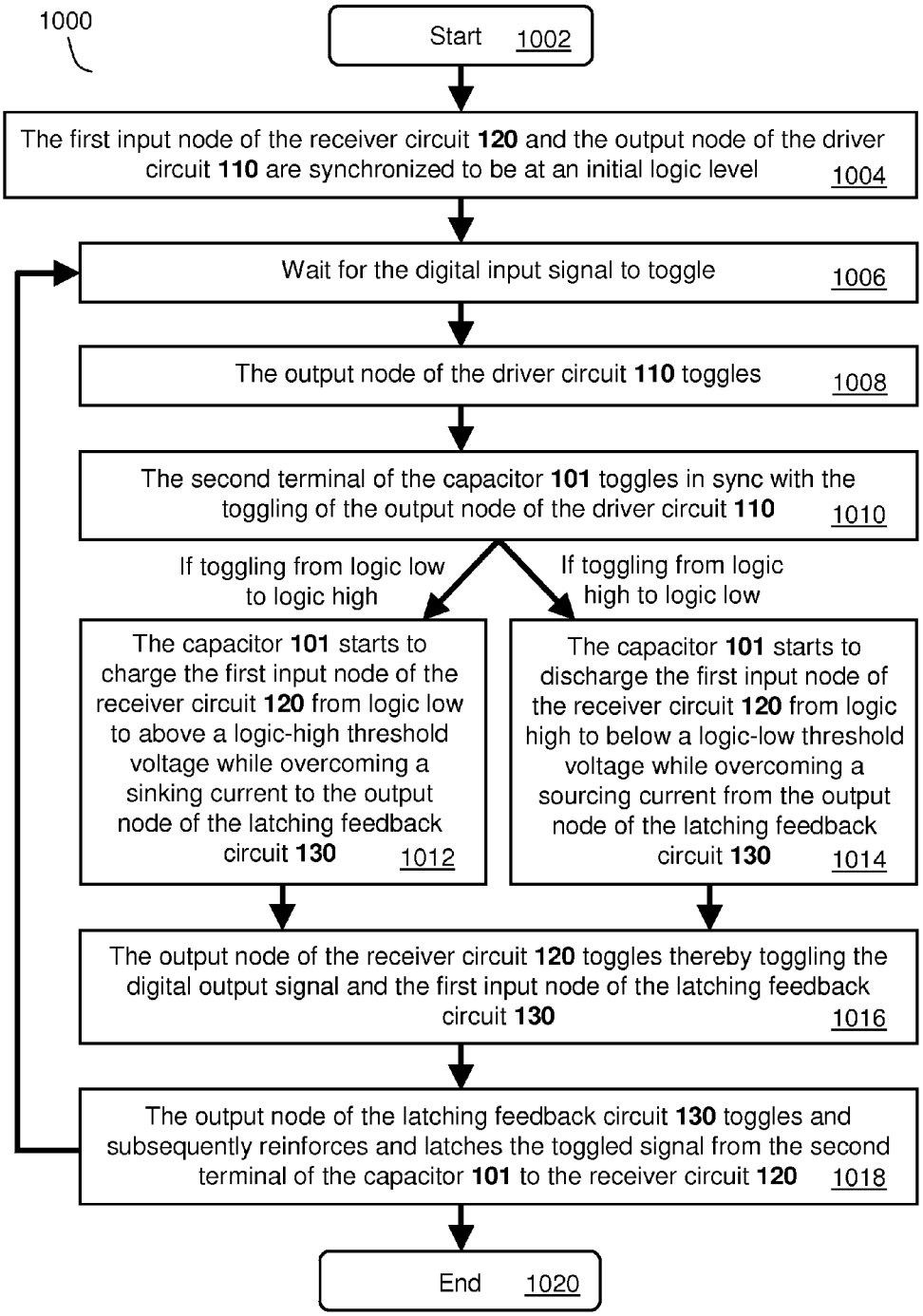
FIG. 10, assisting in understanding

To further assist in understanding, FIG. 10 illustrates the functioning of the level shifter 100 as a process 1000 starting in step 1002. Step 1004 is next, where the first input node of the receiver circuit 120 and the output node of the driver circuit 110 are synchronized to be at an initial logic level. Then step 1006 is next, where the process 1000 waits for the digital input signal to toggle. Then step 1008 is next, where the output node of the driver circuit 110 toggles. And instantaneously in step 1010, the second terminal of the capacitor 101 toggles in sync with the toggling of the output node of the driver circuit 110. If toggling from logic low to logic high, then step 1012 is next, where the capacitor 101 starts to charge the first input node of the receiver circuit 120 from logic low to above a logic-high threshold voltage while overcoming a sinking current to the output node of the latching feedback circuit 130; or if toggling from logic high to logic low, then step 1014 is next, where the capacitor 101 starts to discharge the first input node of the receiver circuit 120 from logic high to below a logic-low threshold voltage while overcoming a sourcing current from the output node of the latching feedback circuit 130. After either step 1012 or 1014, then step 1016 is next, where the output node of the receiver circuit 120 toggles, thereby toggling the digital output signal and the first input node of the latching feedback circuit 130. Then step 1018 is next, where the output node of the latching feedback circuit 130 toggles and subsequently reinforces and latches the toggled signal from the second terminal of the capacitor 101 to the receiver circuit 120 (either reaching logic high at $V_{OUT}$ after steps 1012 and 1016 and 1018, or reaching logic low at $GND_{OUT}$ after steps 1014 and 1016 and 1018). If the digital input signal will continue to toggle, the process 1000 goes back from step 1018 to step 1006 and repeats; otherwise, the process 1000 ends in step 1020.

As illustrated in the process 1000, the output node of the latching feedback circuit 130 serves two opposite purposes one after another. At the instant when the second terminal of the capacitor 101 toggles, the output node of the latching feedback circuit 130 opposes the toggling or change in logic level. When the output node of the latching feedback circuit 130 loops back and toggles, the toggled signal is reinforced by positive feedback and is latched from the second terminal of the capacitor 101 to the receiver circuit 120. Therefore in one embodiment, before the output node of the latching feedback circuit 130 loops back and provides positive feedback, in order to reliably toggle the first input node of the receiver circuit 120, and to overcome an opposing sinking/sourcing current to/from the output node of the latching feedback circuit 130, the capacitance of the capacitor 101 is adapted to be substantially larger than the input capacitance of the first input node of the receiver circuit 120. And in another embodiment, the first input node of the receiver circuit 120 is preferably adapted to have a minimized input capacitance and minimized input current. And in another embodiment, the propagation delays of the receiver circuit 120 and the latching feedback circuit 130 are minimized.

Assuming the output resistance of the latching feedback circuit 130 is $R_{OUT\_130}$ (please note $R_{OUT\_130}$ may be different for logic-high output and for logic-low output), and assuming the output resistance of the driver circuit 110 is $R_{OUT\_110}$ (please note $R_{OUT\_110}$ may be different for logic-high output and for logic-low output), and assuming the resistance of the first resistor 102 is $R_{102}$, and assuming the capacitance of the capacitor 101 is $C_{101}$, the slew rate of $GND_{OUT}$ relative to $GND_{IN}$ that can be tolerated by the level shifter 100 is approximately proportional to the following mathematical expression (1):

$$\frac{1}{(R_{OUT\_130} + R_{OUT\_110} + R_{102})C_{101}} \quad (1)$$

In other words, the smaller the sum of $R_{OUT\_130}$ and $R_{OUT\_110}$ and $R_{102}$, the higher the slew rate; the smaller the $C_{101}$, the higher the slew rate. Therefore, in one embodiment to improve the slew rate of $GND_{OUT}$ relative to $GND_{IN}$ for the level shifter 100, the sum of the output resistance of the latching feedback circuit 130 and the output resistance of the driver circuit 110 and the resistance of the first resistor 102 is minimized, and the capacitance of the capacitor 101 is minimized. In another embodiment, to further reduce the capacitance of the capacitor 101, the input-power-supply amplitude of ($V_{IN}$–$GND_{IN}$) may be adapted to be larger than the output-power-supply amplitude of ($V_{OUT}$–$GND_{OUT}$).

And because $GND_{OUT}$ relative to $GND_{IN}$ may move up and down frequently in real-world applications, the capacitor 101 and the output node of the driver circuit 110 and the output node of the latching feedback circuit 130 may all subsequently undergo frequent charging or discharging. Since a FET complementary output node allows current to flow in and out (for charging or discharging), in one embodiment of the driver circuit 110, the output node of the driver circuit 110 is preferably adapted to be a FET complementary output node; likewise, in another embodiment of the latching feedback circuit 130, the output node of the latching feedback circuit 130 is preferably adapted to be a FET complementary output node. In one embodiment, for a consistent capacitance over a certain operating voltage range and over a certain operating temperature range, and for low cost, the capacitor 101 is preferably adapted to be a ceramic capacitor of COG or NP0 dielectric.

A level shifter of the invention in various embodiments is primarily for ground-potential shifting, and is not primarily for signal-amplitude shifting. However, as another embodiment of the level shifter 100, the digital output signal is optionally adapted to be coupled to a voltage translator (not illustrated) for further amplification or reduction of the digital output signal.

There are at least three methods to synchronize the first input node of the receiver circuit 120 and the output node of the driver circuit 110 to be at an initial logic level. The details are disclosed below.

The first method of synchronization works by toggling the output node of the driver circuit 110 at least twice with sufficiently wide pulse widths. If initially the output node of the driver circuit 110 is at $GND_{IN}$ for logic low while the first input node of the receiver circuit 120 is at $V_{OUT}$ for logic high, after a first toggling, the output node of the driver circuit 110 is switched to be at $V_{IN}$ for logic high, while the capacitor 101 is discharged to $|V_{OUT}$–$V_{IN}|$; after a second toggling, the output node of the driver circuit 110 is switched back to be at $GND_{IN}$ for logic low, while the first input node of the receiver circuit 120 is synchronized to be at $GND_{OUT}$ for logic low. On the other hand, if initially the output node of the driver circuit 110 is at $V_{IN}$ for logic high while the first input node of the receiver circuit 120 is at $GND_{OUT}$ for logic low, after a first toggling, the output node of the driver circuit 110 is switched to be at $GND_{IN}$ for logic low, while the capacitor 101 is charged to $|GND_{OUT}$–$GND_{IN}|$; after a second toggling, the output node of the driver circuit 110 is switched back to be at $V_{IN}$ for logic high, while the first input node of the receiver circuit 120 is synchronized to be at $V_{OUT}$ for logic high. The first method of synchronization works only if the initial uncertainty of the logic level of the digital output signal is allowed for some special designs and applications. And it is imperative to have sufficiently wide pulse widths for the first input node of the receiver circuit 120 to settle at $V_{OUT}$ for logic high or at $GND_{OUT}$ for logic low.

The second method of synchronization works by operating the second input node 153 (if included) of the receiver circuit 120 to initialize the output node of the receiver circuit 120 thereby, through the latching feedback circuit 130, synchronizing the first input node of the receiver circuit 120 and the output node of the driver circuit 110 to be at the initial logic level. If initially the output node of the driver circuit 110 is at $GND_{IN}$ for logic low, and if the receiver circuit 120 further comprises an AND gate 121A (refer to FIG. 2) or a NAND gate 121B (refer to FIG. 3), the second input node 153 is operable to be coupled to logic low thereby, through the latching feedback circuit 130, synchronizing the first input node of the receiver circuit 120 to be at $GND_{OUT}$ for logic low. On the other hand, if initially the output node of the driver circuit 110 is at $V_{IN}$ for logic high, and if the receiver circuit 120 further comprises an OR gate 121D (refer to FIG. 5) or a NOR gate 121C (refer to FIG. 4), the second input node 153 is operable to be coupled to logic high thereby, through the latching feedback circuit 130, synchronizing the first input node of the receiver circuit 120 to be at $V_{OUT}$ for logic high. In one embodiment, the second input node 153 of the receiver circuit 120 is adapted to be coupled to a reset output node of any power-on reset circuit (not illustrated), such as a simple resistor-capacitor (RC) power-on reset circuit.

The third method of synchronization works by operating the second input node 155 (if included) of the latching feedback circuit 130 to initialize the output node of the latching feedback circuit 130 thereby synchronizing the first input node of the receiver circuit 120 and the output node of the driver circuit 110 to be at the initial logic level. If initially the output node of the driver circuit 110 is at $GND_{IN}$ for logic low, and if the latching feedback circuit 130 further comprises an AND gate 131C (refer to FIG. 6) or a NOR gate 131F (refer to FIG. 9), the second input node 155 is operable to be coupled to logic low or logic high respectively thereby synchronizing the first input node of the receiver circuit 120 to be at $GND_{OUT}$ for logic low. On the other hand, if initially the output node of the driver circuit 110 is at $V_{IN}$ for logic high, and if the latching feedback circuit 130 further comprises an OR gate 131E (refer to FIG. 8) or a NAND gate 131D (refer to FIG. 7), the second input node 155 is operable to be coupled to logic high or logic low respectively thereby synchronizing the first input node of the receiver circuit 120 to be at $V_{OUT}$ for logic high. In one embodiment, the second input node 155 of the latching feedback circuit 130 is adapted to be coupled to a reset output node of any power-on reset circuit (not illustrated), such as a simple RC power-on reset circuit.

When the voltage differential between $GND_{OUT}$ and $GND_{IN}$ increases substantially (such as in high-voltage applications), because the capacitor 101 may be charged or discharged rapidly, it is important to protect the following capacitor-101-coupled I/Os against any excessive voltage and/or current stress: the first input node of the receiver circuit 120; the output node of the latching feedback circuit 130; and the output node of the driver circuit 110. More details are disclosed below and are accompanied by FIG. 11 and FIG. 12.

In one embodiment to protect the level shifter 100, the level shifter 100 further comprises one or more zener diodes (not illustrated), wherein each of the zener diode(s) has a zener voltage higher than a respective power supply and is coupled across the respective power supply.

Figure 11:
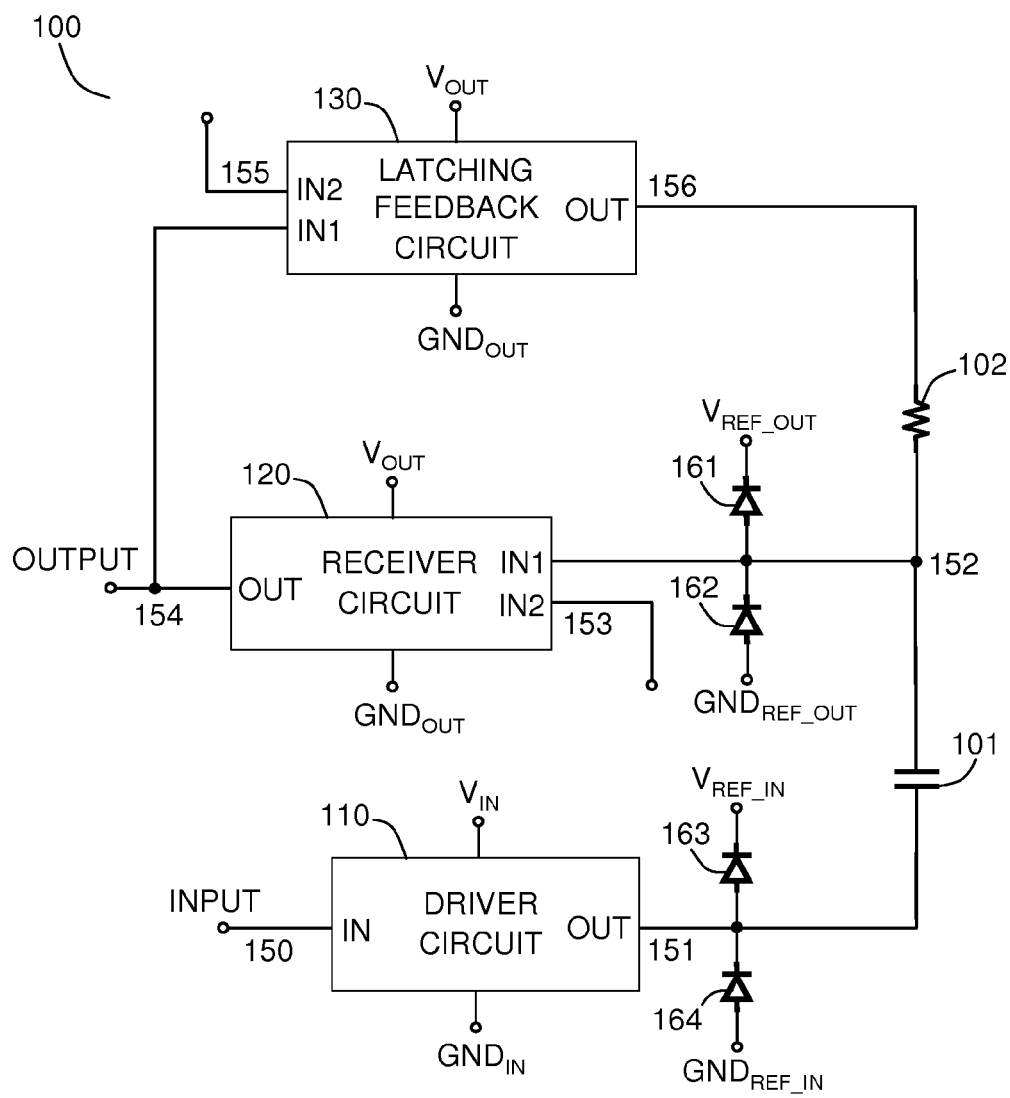
FIG. 11 illustrates one embodiment to protect the first input node of the receiver circuit and the output node of the latching feedback circuit and the output node of the driver circuit for the level shifter, in accordance with the first embodiment of the invention.

As illustrated in FIG. 11, in one embodiment to protect the first input node of the receiver circuit 120 and the output node of the latching feedback circuit 130 and the output node of the driver circuit 110, the level shifter 100 further comprises: a first diode 161 including an anode and a cathode, wherein the anode is coupled to the first input node of the receiver circuit 120, and wherein the cathode is coupled to a reference output voltage $V_{REF\_OUT}$; a second diode 162 including an anode and a cathode, wherein the anode is coupled to a reference output ground potential $GND_{REF\_OUT}$, and wherein the cathode is coupled to the first input node of the receiver circuit 120; a third diode 163 including an anode and a cathode, wherein the anode is coupled to the output node of the driver circuit 110, and wherein the cathode is coupled to a reference input voltage $V_{REF\_IN}$; and a fourth diode 164 including an anode and a cathode, wherein the anode is coupled to a reference input ground potential $GND_{REF\_IN}$, and wherein the cathode is coupled to the output node of the driver circuit 110. In another embodiment, $V_{REF\_OUT}$ is preferably adapted to be higher than or equal to $V_{OUT}$, and $GND_{REF\_OUT}$ is preferably adapted to be lower than or equal to $GND_{OUT}$, and $V_{REF\_IN}$ is preferably adapted to be higher than or equal to $V_{IN}$, and $GND_{REF\_IN}$ is preferably adapted to be lower than or equal to $GND_{IN}$. These diodes 161 and 162 and 163 and 164 are essentially clamping diodes, and may also serve as electrostatic-discharge (ESD) protection diodes. And it is highly desirable for these diodes to possess minimal diode capacitances in order not to significantly interfere with the functioning of the aforementioned capacitive-coupling.

Figure 12:
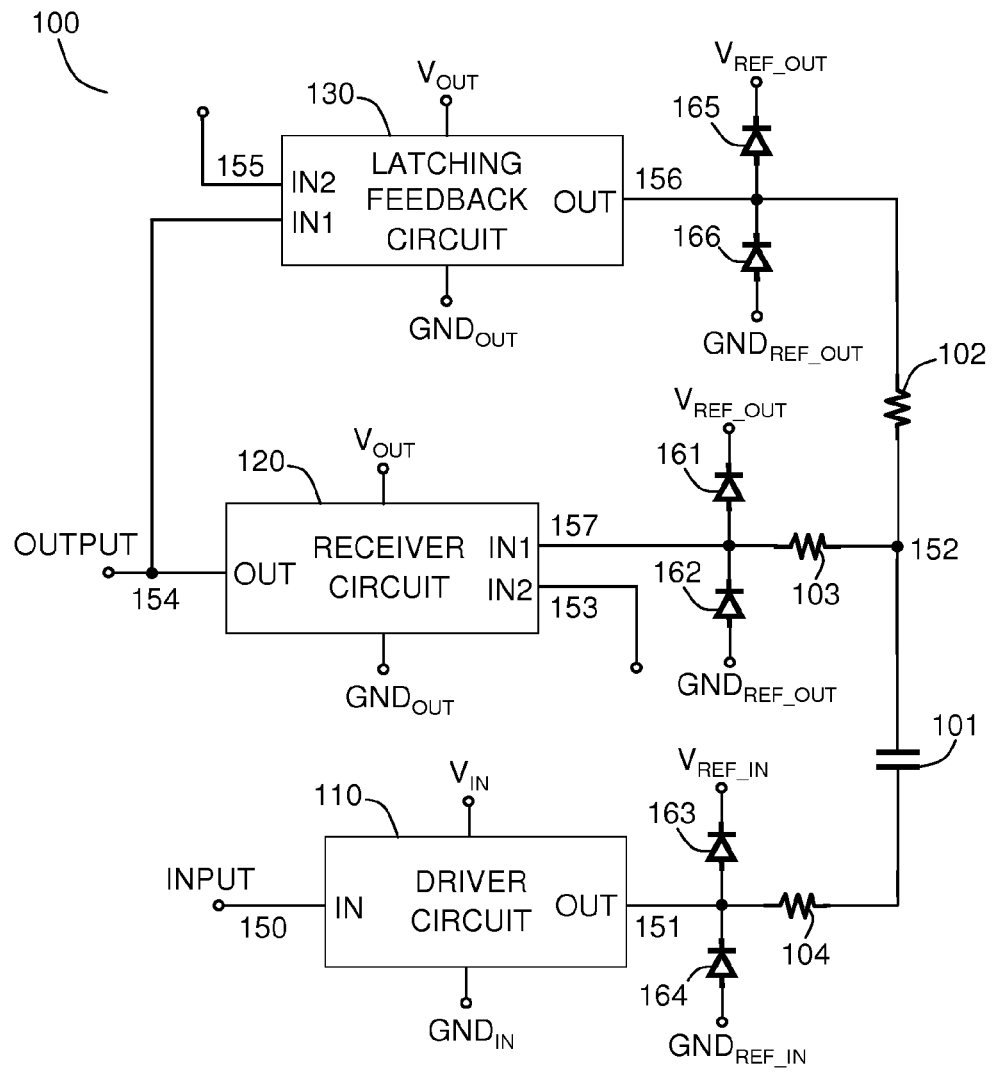
FIG. 12, based on the embodiment illustrated in FIG. 11, illustrates how to further protect the first input node of the receiver circuit and the output node of the latching feedback circuit and the output node of the driver circuit for the level shifter, in accordance with the first embodiment of the invention.

Based on the embodiment illustrated in FIG. 11, to further protect the first input node of the receiver circuit 120 and the output node of the latching feedback circuit 130 and the output node of the driver circuit 110 against any excessive voltage and/or current stress, in another embodiment illustrated in FIG. 12, the level shifter 100 further comprises: a second resistor 103, being inserted between the second terminal of the capacitor 101 and the first input node (at node 157) of the receiver circuit 120; a third resistor 104, being inserted between the first terminal of the capacitor 101 and the output node of the driver circuit 110; a fifth diode 165 including an anode and a cathode, wherein the anode is coupled to the output node of the latching feedback circuit 130, and wherein the cathode is coupled to $V_{REF\_OUT}$; and a sixth diode 166 including an anode and a cathode, wherein the anode is coupled to $GND_{REF\_OUT}$, and wherein the cathode is coupled to the output node of the latching feedback circuit 130. Refer to the mathematical expression (1), assuming the resistance of the third resistor 104 is $R_{104}$, the slew rate of $GND_{OUT}$ relative to $GND_{IN}$ that can be tolerated by the level shifter 100 is updated to be approximately proportional to the following mathematical expression (2):

$$\frac{1}{(R_{OUT\_130} + R_{OUT\_110} + R_{102} + R_{104})C_{101}} \quad (2)$$

In other words, the smaller the sum of $R_{OUT\_130}$ and $R_{OUT\_110}$ and $R_{102}$ and $R_{104}$, the higher the slew rate; the smaller the $C_{101}$, the higher the slew rate. However, for the level shifter 100 to function properly, it is imperative that $(R_{OUT\_130}+R_{102})$ is adapted to be substantially larger than $(R_{OUT\_110}+R_{104})$.

Figure 13:
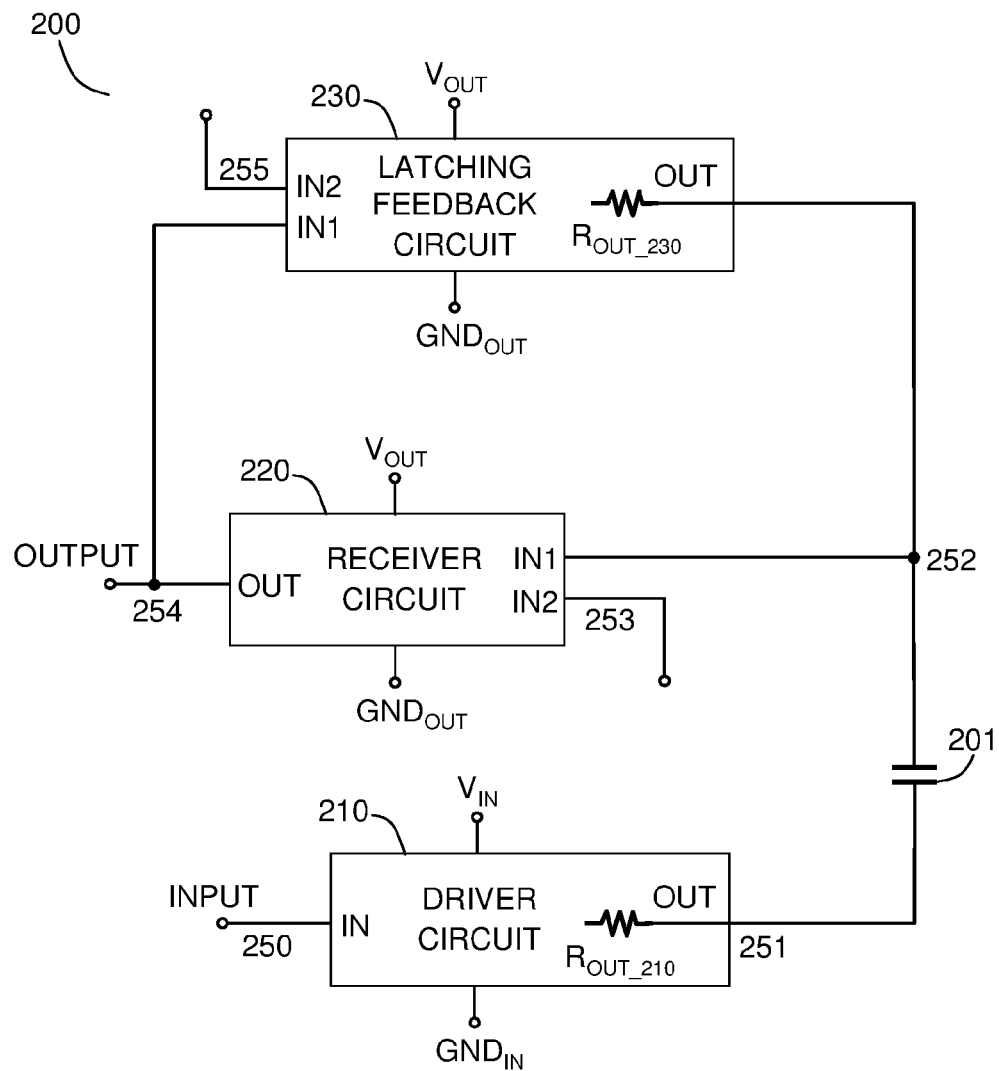
FIG. 13 is a block diagram illustrating the basic structure of a level shifter with a toggling capacitor, in accordance with a second embodiment of the invention.

In a second embodiment of the invention, as illustrated in FIG. 13, a level shifter 200 for level-shifting a digital input signal (at node 250) referenced to an input ground potential $GND_{IN}$ to a digital output signal (at node 254) referenced to an output ground potential $GND_{OUT}$, wherein $GND_{OUT}$ is higher than or equal to or lower than $GND_{IN}$, comprising: a driver circuit 210 including an input node (at node 250) and an output node (at node 251), powered by an input power supply $V_{IN}$ referenced to $GND_{IN}$, and configured as inverting or non-inverting (depending on the requirement(s) of a specific embodiment), and wherein the input node is coupled to the digital input signal, and wherein the output node toggles when the digital input signal toggles; a capacitor 201 including a first terminal (at node 251) and a second terminal (at node 252), wherein the first terminal is coupled to the output node of the driver circuit 210, and wherein the second terminal toggles in sync with the toggling of the output node of the driver circuit 210; a receiver circuit 220 including a first input node (coupled to node 252) and an output node (at node 254), powered by an output power supply $V_{OUT}$ referenced to $GND_{OUT}$, and wherein the first input node is coupled to the second terminal of the capacitor 201, and wherein the output node is coupled to the digital output signal, and wherein the digital output signal toggles when the second terminal of the capacitor 201 toggles; and a latching feedback circuit 230 including a first input node (at node 254) and an output node (at node 252), powered by $V_{OUT}$ referenced to $GND_{OUT}$, and wherein the first input node is coupled to the output node of the receiver circuit 220, and wherein the output node is coupled to the second terminal of the capacitor 201, and wherein the output resistance $R_{OUT\_230}$ of the latching feedback circuit 230 is substantially larger than the output resistance $R_{OUT\_210}$ of the driver circuit 210, and configured as non-inverting if the receiver circuit 220 is non-inverting, or configured as inverting if the receiver circuit 220 is inverting, thereby providing a positive feedback loop to latch a toggled signal from the second terminal of the capacitor 201 to the receiver circuit 220.

In one embodiment, the receiver circuit 220 may further includes a second input node 253 for initializing or enabling the receiver circuit 220, and wherein the second input node 253 is operable to synchronize the first input node of the receiver circuit 220 and the output node of the driver circuit 210 to be at an initial logic level, and wherein the receiver circuit 220 further comprises an AND gate or a NAND gate or an OR gate or a NOR gate including: a first input terminal and a second input terminal and an output terminal, coupled respectively to the first input node and the second input node 253 and the output node of the receiver circuit 220.

In one embodiment, the latching feedback circuit 230 may further includes a second input node 255 for initializing or enabling the latching feedback circuit 230, and wherein the second input node 255 is operable to synchronize the first input node of the receiver circuit 220 and the output node of the driver circuit 210 to be at an initial logic level, and wherein the latching feedback circuit 230 further comprises an AND gate or a NAND gate or an OR gate or a NOR gate including: a first input terminal and a second input terminal and an output terminal, coupled respectively to the first input node and the second input node 255 and the output node of the latching feedback circuit 230.

Figure 14:
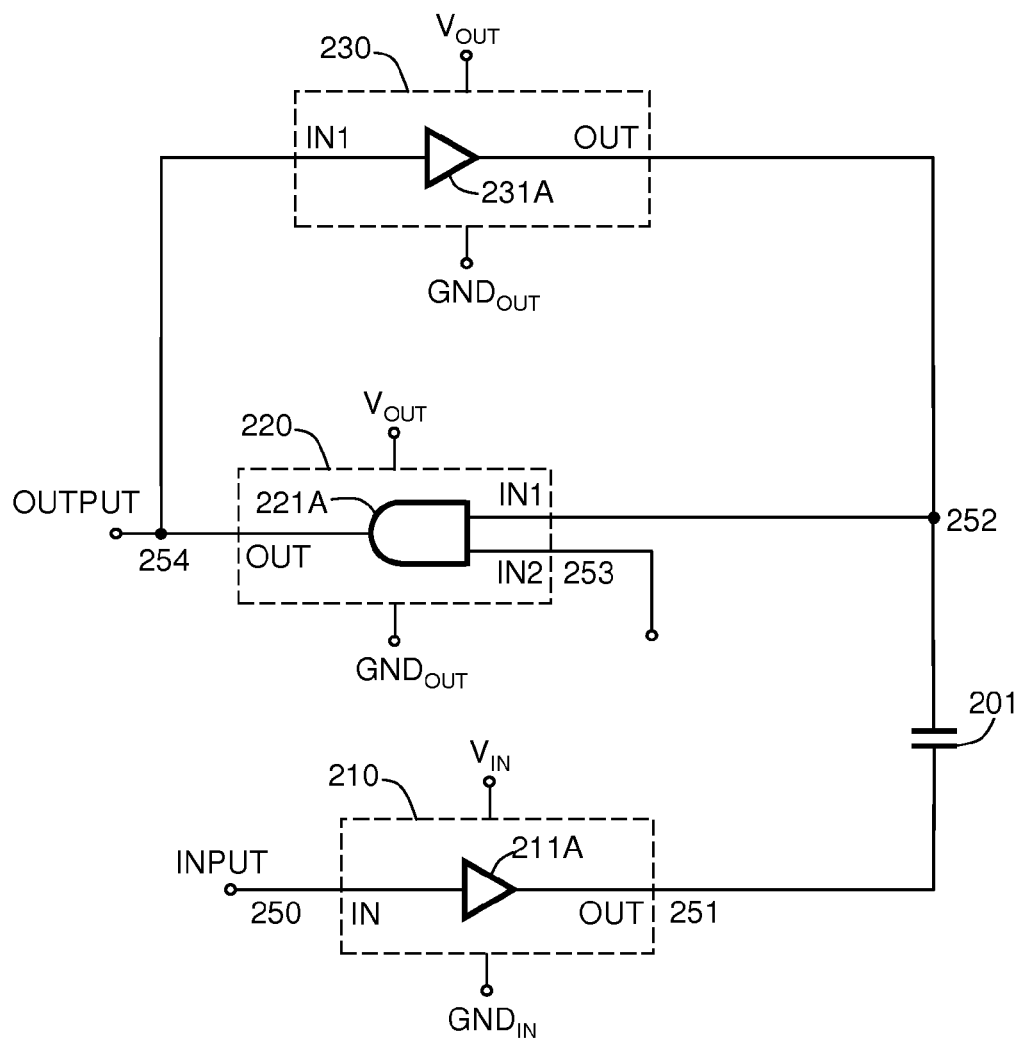
FIG. 14 illustrates some exemplary embodiments of the driver circuit, the receiver circuit and the latching feedback circuit, in accordance with the second embodiment of the invention.

FIG. 14 illustrates some exemplary embodiments of the driver circuit 210, the receiver circuit 220 and the latching feedback circuit 230. The driver circuit 210 further comprises a non-inverting buffer 211A including: an input terminal and an output terminal, coupled respectively to the input node and the output node of the driver circuit 210. The receiver circuit 220 further comprises an AND gate 221A including: a first input terminal and a second input terminal and an output terminal, coupled respectively to the first input node and the optional second input node 253 and the output node of the receiver circuit 220. The latching feedback circuit 230 further comprises a non-inverting buffer 231A including: an input terminal and an output terminal, coupled respectively to the first input node and the output node of the latching feedback circuit 230. Both the AND gate 221A and the buffer 231A are non-inverting, and are operable to provide a positive feedback loop to latch a toggled signal from the second terminal of the capacitor 201 to the receiver circuit 220. When the second input node 253 is at logic low, the output of the AND gate 221A is forced to be at logic low; then the output of the non-inverting buffer 231A is also at logic low thereby initializing the first input node of the receiver circuit 220 to be at logic low. And when the second input node 253 is at logic high, the AND gate 221A is enabled to function as a non-inverting buffer.

Figure 15:
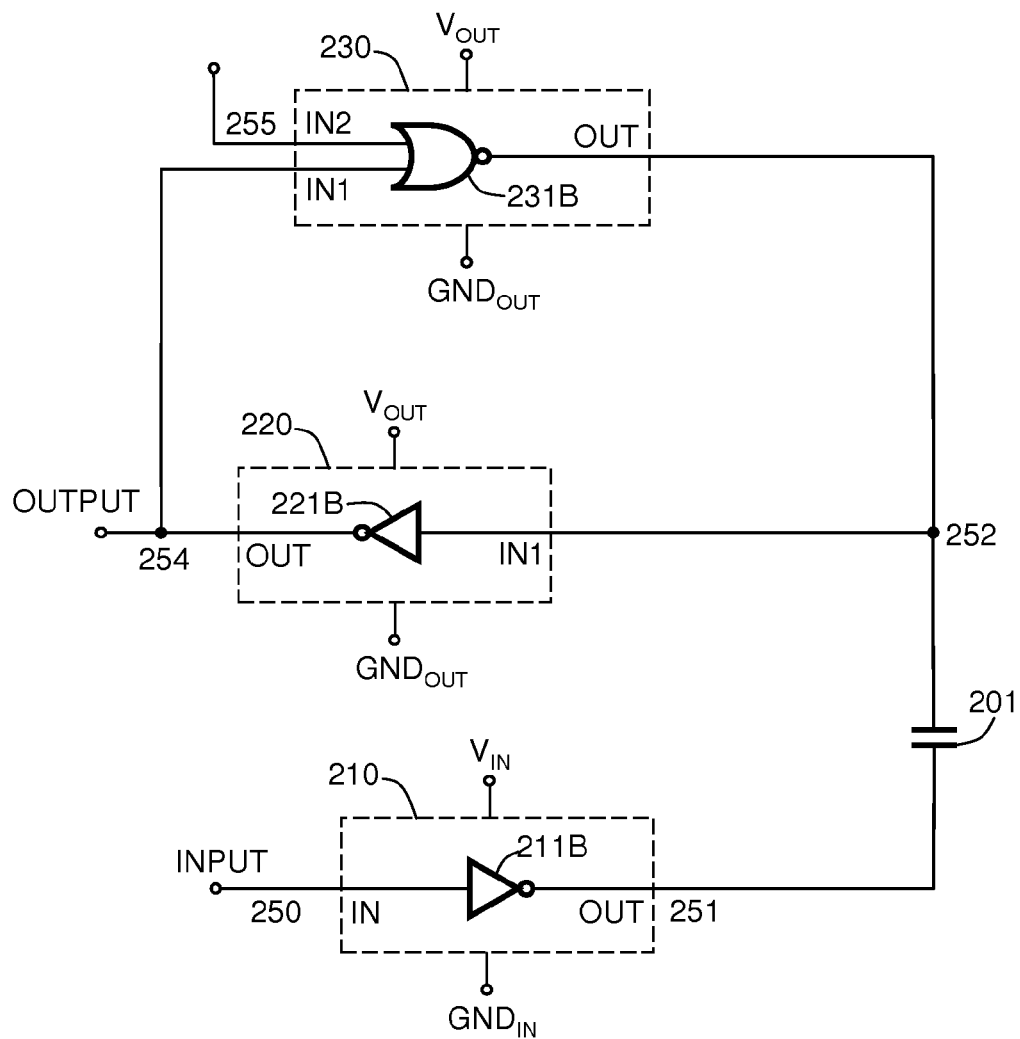
FIG. 15 illustrates more exemplary embodiments of the driver circuit, the receiver circuit and the latching feedback circuit, in accordance with the second embodiment of the invention.

FIG. 15 illustrates more exemplary embodiments of the driver circuit 210, the receiver circuit 220 and the latching feedback circuit 230. The driver circuit 210 further comprises an inverting buffer 211B including: an input terminal and an output terminal, coupled respectively to the input node and the output node of the driver circuit 210. The receiver circuit 220 further comprises an inverting buffer 221B including: an input terminal and an output terminal, coupled respectively to the first input node and the output node of the receiver circuit 220. The latching feedback circuit 230 further comprises a NAND gate 231B including: a first input terminal and a second input terminal and an output terminal, coupled respectively to the first input node and the optional second input node 255 and the output node of the latching feedback circuit 230. Both the buffer 221B and the NAND gate 231B are inverting, and are operable to provide a positive feedback loop to latch a toggled signal from the second terminal of the capacitor 201 to the receiver circuit 220. When the second input node 255 is at logic low, the output of the NAND gate 231B is forced to be at logic high thereby initializing the first input node of the receiver circuit 220 to be at logic high. And when the second input node 255 is at logic high, the NAND gate 231B is enabled to function as an inverting buffer.

Assuming the output resistance of the latching feedback circuit 230 is $R_{OUT\_230}$, and assuming the output resistance of the driver circuit 210 is $R_{OUT\_210}$, and assuming the capacitance of the capacitor 201 is $C_{201}$, the slew rate of $GND_{OUT}$ relative to $GND_{IN}$ that can be tolerated by the level shifter 200 is approximately proportional to the following mathematical expression (3):

$$\frac{1}{(R_{OUT\_230} + R_{OUT\_210})C_{201}} \tag{3}$$

In other words, the smaller the sum of $R_{OUT\_230}$ and $R_{OUT\_210}$, the higher the slew rate; the smaller the $C_{201}$, the higher the slew rate.

In one embodiment, the capacitance of the capacitor 201 is adapted to be substantially larger than the input capacitance of the first input node of the receiver circuit 220, and the first input node of the receiver circuit 220 has a minimized input capacitance and minimized input current. In one embodiment, to protect I/Os, the level shifter 200 may further comprise one or more pairs of clamping diodes. And in one embodiment, to further protect the level shifter 200, the level shifter 200 may further comprise one or more zener diodes, wherein each of the zener diode(s) is coupled across a respective power supply.

Figure 16:
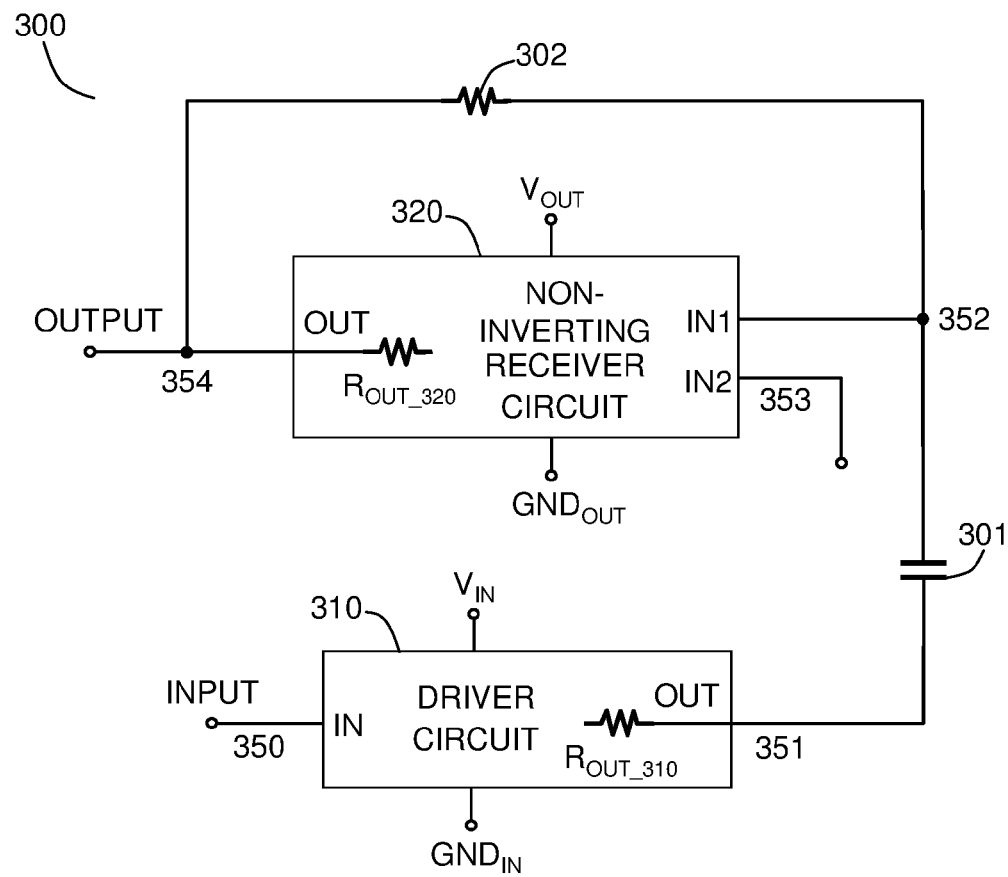
FIG. 16 is a block diagram illustrating the basic structure of a level shifter with a toggling capacitor, in accordance with a third embodiment of the invention.

In a third embodiment of the invention, as illustrated in FIG. 16, a level shifter 300 for level-shifting a digital input signal (at node 350) referenced to an input ground potential $GND_{IN}$ to a digital output signal (at node 354) referenced to an output ground potential $GND_{OUT}$, wherein $GND_{OUT}$ is higher than or equal to or lower than $GND_{IN}$, comprising: a driver circuit 310 including an input node (at node 350) and an output node (at node 351), powered by an input power supply $V_{IN}$ referenced to $GND_{IN}$, and configured as inverting or non-inverting (depending on the requirement(s) of a specific embodiment), and wherein the input node is coupled to the digital input signal, and wherein the output node toggles when the digital input signal toggles; a capacitor 301 including a first terminal (at node 351) and a second terminal (at node 352), wherein the first terminal is coupled to the output node of the driver circuit 310, and wherein the second terminal toggles in sync with the toggling of the output node of the driver circuit 310; a first resistor 302 including a first terminal (at node 352) and a second terminal (at node 354), wherein the first terminal of the first resistor 302 is coupled to the second terminal of the capacitor 301; a non-inverting receiver circuit 320 including a first input node (coupled to node 352) and an output node (at node 354), powered by an output power supply $V_{OUT}$ referenced to $GND_{OUT}$, and wherein the first input node is coupled to the second terminal of the capacitor 301, and wherein the output node is coupled both to the digital output signal and to the second terminal of the first resistor 302, and wherein the sum of the output resistance $R_{OUT\_320}$ of the non-inverting receiver circuit 320 and the resistance of the first resistor 302 is substantially larger than the output resistance $R_{OUT\_310}$ of the driver circuit 310, and wherein the digital output signal toggles when the second terminal of the capacitor 301 toggles, and wherein the output node provides a positive feedback loop to latch a toggled signal from the second terminal of the capacitor 301 to the non-inverting receiver circuit 320. Compared with the first or the second embodiment of the invention, the non-inverting receiver circuit 320 performs equivalently to the combination of a receiver circuit (120 or 220) and a latching feedback circuit (130 or 230).

In one embodiment, the non-inverting receiver circuit 320 may further includes a second input node 353 for initializing or enabling the non-inverting receiver circuit 320, and wherein the second input node 353 is operable to synchronize the first input node of the non-inverting receiver circuit 320 and the output node of the driver circuit 310 to be at an initial logic level, and wherein the non-inverting receiver circuit 320 further comprises an AND gate or an OR gate including: a first input terminal and a second input terminal and an output terminal, coupled respectively to the first input node and the second input node 353 and the output node of the non-inverting receiver circuit 320.

Figure 17:
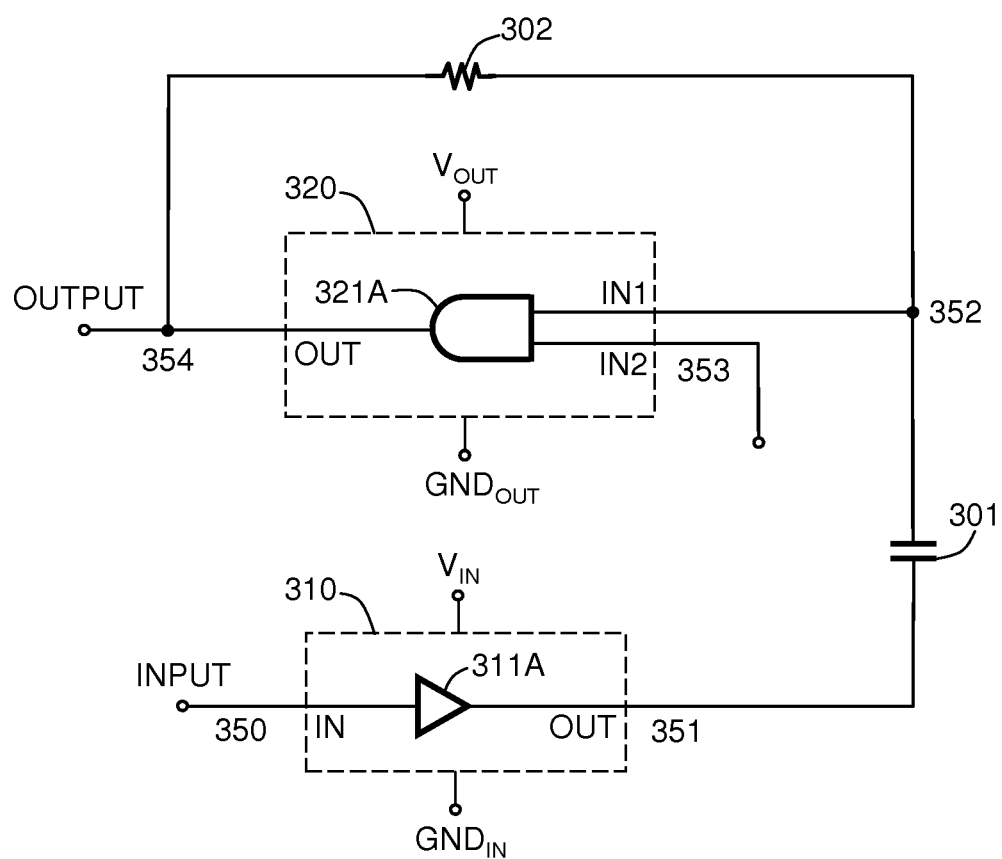
FIG. 17 illustrates some exemplary embodiments of the driver circuit and the non-inverting receiver circuit, in accordance with the third embodiment of the invention.

FIG. 17 illustrates some exemplary embodiments of the driver circuit 310 and the non-inverting receiver circuit 320. The driver circuit 310 further comprises a non-inverting buffer 311A including: an input terminal and an output terminal, coupled respectively to the input node and the output node of the driver circuit 310. The non-inverting receiver circuit 320 further comprises an AND gate 321A including: a first input terminal and a second input terminal and an output terminal, coupled respectively to the first input node and the optional second input node 353 and the output node of the non-inverting receiver circuit 320. When the second input node 353 is at logic low, the output of the AND gate 321A is forced to be at logic low thereby initializing the first input node of the non-inverting receiver circuit 320 to be at logic low. And when the second input node 353 is at logic high, the AND gate 321A is enabled to function as a non-inverting buffer.

Figure 18:
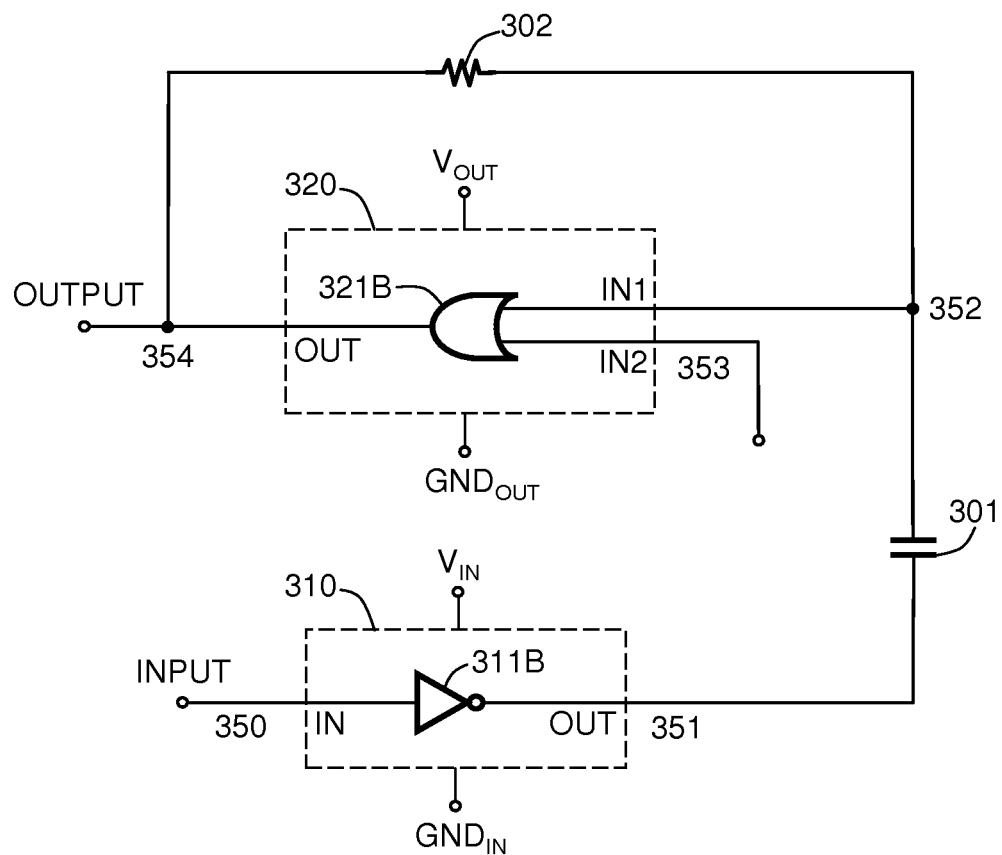
FIG. 18 illustrates more exemplary embodiments of the driver circuit and the non-inverting receiver circuit, in accordance with the third embodiment of the invention.

FIG. 18 illustrates more exemplary embodiments of the driver circuit 310 and the non-inverting receiver circuit 320. The driver circuit 310 further comprises an inverting buffer 311B including: an input terminal and an output terminal, coupled respectively to the input node and the output node of the driver circuit 310. The non-inverting receiver circuit 320 further comprises an OR gate 321B including: a first input terminal and a second input terminal and an output terminal, coupled respectively to the first input node and the optional second input node 353 and the output node of the non-inverting receiver circuit 320. When the second input node 353 is at logic high, the output of the OR gate 321B is forced to be at logic high thereby initializing the first input node of the non-inverting receiver circuit 320 to be at logic high. And when the second input node 353 is at logic low, the OR gate 321B is enabled to function as a non-inverting buffer.

Assuming the output resistance of the non-inverting receiver circuit 320 is $R_{OUT\_320}$, and assuming the output resistance of the driver circuit 310 is $R_{OUT\_310}$, and assuming the capacitance of the capacitor 301 is $C_{301}$, the slew rate of $GND_{OUT}$ relative to $GND_{IN}$ that can be tolerated by the level shifter 300 is approximately proportional to the following mathematical expression (4):

$$\frac{1}{(R_{OUT\_320} + R_{OUT\_310})C_{301}} \qquad (4)$$

In other words, the smaller the sum of $R_{OUT\_320}$ and $R_{OUT\_310}$, the higher the slew rate; the smaller the $C_{301}$, the higher the slew rate.

In one embodiment, the capacitance of the capacitor 301 is adapted to be substantially larger than the input capacitance of the first input node of the non-inverting receiver circuit 320, and the first input node of the non-inverting receiver circuit 320 has a minimized input capacitance and minimized input current. In one embodiment, to protect I/Os, the level shifter 300 may further comprise one or more pairs of clamping diodes. And in one embodiment, to further protect the level shifter 300, the level shifter 300 may further comprise one or more zener diodes, wherein each of the zener diode(s) is coupled across a respective power supply.

INDUSTRIAL APPLICABILITY

In view of the foregoing, the industrial applicability of the present invention is broad and can provide a level shifter which is scalable from low-voltage to high-voltage applications, and which can tolerate substantial slew rate of output ground potential relative to input ground potential, and which has short and easy-to-match propagation delays, and which consumes low power, and which is low-cost. Applications of such a level shifter include any level-shifting of a digital input signal referenced to an input ground potential to a digital output signal referenced to an output ground potential, such as battery management systems, supercapacitor management systems, and so forth.

While the foregoing invention shows a number of illustrative and descriptive embodiments of the invention, it will be apparent to any person with ordinary skills in the area of technology related to the invention that various changes, modifications, substitutions and combinations can be made herein without departing from the scope or the spirit of the invention as defined by the following claims.

The invention claimed is:

1. A level shifter for level-shifting a digital input signal referenced to an input ground potential to a digital output signal referenced to an output ground potential, wherein the output ground potential is higher than or equal to or lower than the input ground potential, comprising:

a driver circuit including an input node and an output node, powered by an input power supply referenced to the input ground potential, and configured as inverting or non-inverting, and wherein the input node is coupled to the digital input signal, and wherein the output node toggles when the digital input signal toggles;

a capacitor including a first terminal and a second terminal, wherein the first terminal is coupled to the output node of the driver circuit, and wherein the second terminal toggles in sync with the toggling of the output node of the driver circuit;

a first resistor including a first terminal and a second terminal, wherein the first terminal is coupled to the second terminal of the capacitor;

a receiver circuit including a first input node and an output node, powered by an output power supply referenced to the output ground potential, and wherein the first input node is coupled to the second terminal of the capacitor, and wherein the output node is coupled to the digital output signal, and wherein the digital output signal toggles when the second terminal of the capacitor toggles; and a latching feedback circuit including a first input node and an output node, powered by the output power supply referenced to the output ground potential, and wherein the first input node is coupled to the output node of the receiver circuit, and wherein the output node is coupled to the second terminal of the first resistor, and wherein the sum of the output resistance of the latching feedback circuit and the resistance of the first resistor is larger than the output resistance of the driver circuit, and configured as non-inverting if the receiver circuit is non-inverting, or configured as inverting if the receiver circuit is inverting, thereby providing a positive feedback loop to latch a toggled signal from the second terminal of the capacitor to the receiver circuit.

2. The level shifter of claim 1, wherein the receiver circuit further includes a second input node for initializing or enabling the receiver circuit, and wherein the second input node is operable to synchronize the first input node of the receiver circuit and the output node of the driver circuit to be at an initial logic level, and wherein the receiver circuit further comprises an AND gate or a NAND gate or an OR gate or a NOR gate including: a first input terminal and a second input terminal and an output terminal, coupled respectively to the first input node and the second input node and the output node of the receiver circuit.

3. The level shifter of claim 2, wherein the second input node of the receiver circuit is adapted to be coupled to a reset output node of a power-on reset circuit.

4. The level shifter of claim 1, wherein the latching feedback circuit further includes a second input node for initializing or enabling the latching feedback circuit, and wherein the second input node is operable to synchronize the first input node of the receiver circuit and the output node of the driver circuit to be at an initial logic level, and wherein the latching feedback circuit further comprises an AND gate or a NAND gate or an OR gate or a NOR gate including: a first input terminal and a second input terminal and an output terminal, coupled respectively to the first input node and the second input node and the output node of the latching feedback circuit.

5. The level shifter of claim 4, wherein the second input node of the latching feedback circuit is adapted to be coupled to a reset output node of a power-on reset circuit.

6. The level shifter of claim 1, wherein the capacitance of the capacitor is adapted to be substantially larger than the input capacitance of the first input node of the receiver circuit, and wherein the first input node of the receiver circuit has a minimized input capacitance and minimized input current.

7. The level shifter of claim 1, wherein to improve the slew rate of the output ground potential relative to the input ground potential for the level shifter, the sum of the output resistance of the latching feedback circuit and the output resistance of the driver circuit and the resistance of the first resistor is minimized, and wherein the capacitance of the capacitor is minimized.

8. The level shifter of claim 7, wherein to further reduce the capacitance of the capacitor, the input-power-supply amplitude of (the input power supply minus the input ground potential) is adapted to be larger than the output-power-supply amplitude of (the output power supply minus the output ground potential).

9. The level shifter of claim 1, wherein the output node of the driver circuit is adapted to be a FET complementary output node, and wherein the output node of the latching feedback circuit is adapted to be a FET complementary output node.

10. The level shifter of claim 1, wherein the digital output signal is adapted to be coupled to a voltage translator for further amplification or reduction of the digital output signal.

11. The level shifter of claim 1, wherein to synchronize the first input node of the receiver circuit and the output node of the driver circuit to be at an initial logic level, the output node of the driver circuit is operable to be toggled at least twice.

12. The level shifter of claim 1, wherein to protect the level shifter, the level shifter further comprises one or more zener diodes, and wherein each of the zener diode(s) has a zener voltage higher than a respective power supply and is coupled across the respective power supply.

13. The level shifter of claim 1, wherein to protect the first input node of the receiver circuit and the output node of the latching feedback circuit and the output node of the driver circuit, the level shifter further comprises:

a first diode including an anode and a cathode, wherein the anode is coupled to the first input node of the receiver circuit, and wherein the cathode is coupled to a reference output voltage;

a second diode including an anode and a cathode, wherein the anode is coupled to a reference output ground potential, and wherein the cathode is coupled to the first input node of the receiver circuit;

a third diode including an anode and a cathode, wherein the anode is coupled to the output node of the driver circuit, and wherein the cathode is coupled to a reference input voltage; and a forth diode including an anode and a cathode, wherein the anode is coupled to a reference input ground potential, and wherein the cathode is coupled to the output node of the driver circuit.

14. The level shifter of claim 13, wherein the reference output voltage is higher than or equal to the output power supply, and wherein the reference output ground potential is lower than or equal to the output ground potential, and wherein the reference input voltage is higher than or equal to the input power supply, and wherein the reference input ground potential is lower than or equal to the input ground potential.

15. The level shifter of claim 13, wherein the level shifter further comprises:

a second resistor, being inserted between the second terminal of the capacitor and the first input node of the receiver circuit;
a third resistor, being inserted between the first terminal of the capacitor and the output node of the driver circuit;
a fifth diode including an anode and a cathode, wherein the anode is coupled to the output node of the latching feedback circuit, and wherein the cathode is coupled to the reference output voltage; and
a sixth diode including an anode and a cathode, wherein the anode is coupled to the reference output ground potential, and wherein the cathode is coupled to the output node of the latching feedback circuit.

16. A level shifter for level-shifting a digital input signal referenced to an input ground potential to a digital output signal referenced to an output ground potential, wherein the output ground potential is higher than or equal to or lower than the input ground potential, comprising:
a driver circuit including an input node and an output node, powered by an input power supply referenced to the input ground potential, and configured as inverting or non-inverting, and wherein the input node is coupled to the digital input signal, and wherein the output node toggles when the digital input signal toggles;
a single capacitor including a first terminal and a second terminal, wherein the first terminal is coupled to the output node of the driver circuit, and wherein the second terminal toggles in sync with the toggling of the output node of the driver circuit;
a receiver circuit including a first input node and an output node, powered by an output power supply referenced to the output ground potential, and wherein the first input node is coupled to the second terminal of the single capacitor, and wherein the output node is coupled to the digital output signal, and wherein the digital output signal toggles when the second terminal of the single capacitor toggles; and
a latching feedback circuit including a first input node and an output node, powered by the output power supply referenced to the output ground potential, and wherein the first input node is coupled to the output node of the receiver circuit, and wherein the output node is coupled to the second terminal of the single capacitor, and wherein the output resistance of the latching feedback circuit is larger than the output resistance of the driver circuit, and configured as non-inverting if the receiver circuit is non-inverting, or configured as inverting if the receiver circuit is inverting, thereby providing a positive feedback loop to latch a toggled signal from the second terminal of the capacitor to the receiver circuit.

17. The level shifter of claim 16, wherein the receiver circuit further includes a second input node for initializing or enabling the receiver circuit, and wherein the second input node is operable to synchronize the first input node of the receiver circuit and the output node of the driver circuit to be at an initial logic level, and wherein the receiver circuit further comprises an AND gate or a NAND gate or an OR gate or a NOR gate including: a first input terminal and a second input terminal and an output terminal, coupled respectively to the first input node and the second input node and the output node of the receiver circuit.

18. The level shifter of claim 16, wherein the latching feedback circuit further includes a second input node for initializing or enabling the latching feedback circuit, and wherein the second input node is operable to synchronize the first input node of the receiver circuit and the output node of the driver circuit to be at an initial logic level, and wherein the latching feedback circuit further comprises an AND gate or a NAND gate or an OR gate or a NOR gate including: a first input terminal and a second input terminal and an output terminal, coupled respectively to the first input node and the second input node and the output node of the latching feedback circuit.

19. A level shifter for level-shifting a digital input signal referenced to an input ground potential to a digital output signal referenced to an output ground potential, wherein the output ground potential is higher than or equal to or lower than the input ground potential, comprising:
a driver circuit including an input node and an output node, powered by an input power supply referenced to the input ground potential, and configured as inverting or non-inverting, and wherein the input node is coupled to the digital input signal, and wherein the output node toggles when the digital input signal toggles;
a capacitor including a first terminal and a second terminal, wherein the first terminal is coupled to the output node of the driver circuit, and wherein the second terminal toggles in sync with the toggling of the output node of the driver circuit;
a first resistor including a first terminal and a second terminal, wherein the first terminal is coupled to the second terminal of the capacitor; and
a non-inverting receiver circuit including a first input node and an output node, powered by an output power supply referenced to the output ground potential, and wherein the first input node is coupled to the second terminal of the capacitor, and wherein the output node is coupled both to the digital output signal and to the second terminal of the first resistor, and wherein the sum of the output resistance of the non-inverting receiver circuit and the resistance of the first resistor is larger than the output resistance of the driver circuit, and wherein the digital output signal toggles when the second terminal of the capacitor toggles, and wherein the output node provides a positive feedback loop to latch a toggled signal from the second terminal of the capacitor to the non-inverting receiver circuit.

20. The level shifter of claim 19, wherein the non-inverting receiver circuit further includes a second input node for initializing or enabling the non-inverting receiver circuit, and wherein the second input node is operable to synchronize the first input node of the non-inverting receiver circuit and the output node of the driver circuit to be at an initial logic level, and wherein the non-inverting receiver circuit further comprises an AND gate or an OR gate including: a first input terminal and a second input terminal and an output terminal, coupled respectively to the first input node and the second input node and the output node of the non-inverting receiver circuit.

* * * * *